US012604109B2

(12) United States Patent
Roh et al.

(10) Patent No.: US 12,604,109 B2
(45) Date of Patent: Apr. 14, 2026

(54) IMAGE SENSOR INCLUDING IMAGING PIXELS AND AUTOFOCUSING PIXELS AND ELECTRONIC APPARATUS INCLUDING THE IMAGE SENSOR

(71) Applicant: SAMSUNG ELECTRONICS CO., LTD., Suwon-si (KR)

(72) Inventors: Sookyoung Roh, Suwon-si (KR); Junho Lee, Suwon-si (KR); Seokho Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 207 days.

(21) Appl. No.: 18/227,095

(22) Filed: Jul. 27, 2023

(65) Prior Publication Data

US 2024/0040273 A1      Feb. 1, 2024

(30) Foreign Application Priority Data

Jul. 27, 2022      (KR) ........................ 10-2022-0093456

(51) Int. Cl.
H04N 25/17 (2023.01)
G02B 3/00 (2006.01)
(Continued)

(52) U.S. Cl.
CPC ........... H04N 25/17 (2023.01); G02B 3/0037 (2013.01); G02B 7/36 (2013.01); H04N 23/67 (2023.01);
(Continued)

(58) Field of Classification Search
CPC ...... H04N 25/17; H04N 23/67; H04N 25/704; G02B 3/0037; G02B 7/36; H10F 39/182;
(Continued)

(56) References Cited

U.S. PATENT DOCUMENTS

| | | | |
|---|---|---|---|
| 8,507,840 B2 | 8/2013 | Yu et al. |
| 9,543,458 B2 | 1/2017 | Wober |

(Continued)

FOREIGN PATENT DOCUMENTS

| | | |
|---|---|---|
| JP | 2014-209625 A | 11/2014 |
| KR | 10-1468369 B1 | 12/2014 |

(Continued)

OTHER PUBLICATIONS

Communication dated Mar. 11, 2024, issued by European Patent Office in European Patent Application No. 23187584.0.
(Continued)

*Primary Examiner* — Gevell V Selby

(74) *Attorney, Agent, or Firm* — Sughrue Mion, PLLC

(57)      ABSTRACT

Provided is an image sensor including a pixel array including a plurality of imaging pixels and a plurality of autofocusing pixels, and a lens array including a plurality of micro lenses facing the plurality of imaging pixels, respectively, and one or more super lenses facing the plurality of autofocusing pixels, wherein each imaging pixel of the plurality of imaging pixels includes a first red meta-photodiode configured to selectively absorb light of a red wavelength band, a first green meta-photodiode configured to selectively absorb light of a green wavelength band, and a first blue meta-photodiode configured to selectively absorb light of a blue wavelength band.

19 Claims, 35 Drawing Sheets

(51) Int. Cl.

| | |
|---|---|
| *G02B 7/36* | (2021.01) |
| *H04N 23/67* | (2023.01) |
| *H04N 25/704* | (2023.01) |
| *H10F 39/00* | (2025.01) |
| *H10F 39/18* | (2025.01) |

(52) U.S. Cl.
CPC ......... *H04N 25/704* (2023.01); *H10F 39/182* (2025.01); *H10F 39/8063* (2025.01)

(58) Field of Classification Search
CPC ............. H10F 39/8063; H10F 39/8053; H10F 39/806; H10F 39/8023; H10F 39/802; H10F 39/18; H10F 39/803
See application file for complete search history.

(56) References Cited

U.S. PATENT DOCUMENTS

| | | | |
|---|---|---|---|
| 2016/0172399 A1 | 6/2016 | Nakata | |
| 2016/0205311 A1* | 7/2016 | Mandelli | H04N 25/134 |
| | | | 348/349 |

| | | | |
|---|---|---|---|
| 2016/0240580 A1 | 8/2016 | Xianyu et al. | |
| 2019/0166317 A1* | 5/2019 | Tanaka | H04N 25/778 |
| 2021/0344882 A1 | 11/2021 | Park et al. | |
| 2022/0102413 A1* | 3/2022 | Cho | H04N 25/704 |
| 2022/0132079 A1* | 4/2022 | Choi | H04N 25/78 |
| 2022/0377267 A1* | 11/2022 | Lim | H04N 25/778 |
| 2023/0084394 A1 | 3/2023 | Lee et al. | |
| 2023/0395626 A1* | 12/2023 | Yang | H04N 25/11 |

FOREIGN PATENT DOCUMENTS

| | | |
|---|---|---|
| KR | 10-2016-0099386 A | 8/2016 |
| KR | 10-2022-0043556 A | 4/2022 |
| KR | 10-2022-0055390 A | 5/2022 |
| KR | 10-2022-0070554 A | 5/2022 |

OTHER PUBLICATIONS

Communications dated Jan. 16, 2026 issued by the Korean Intellectual Property Office in counterpart Korean Application No. 10-2022-0093456.

* cited by examiner

[Security]                    2800

2900

IMAGE SENSOR INCLUDING IMAGING PIXELS AND AUTOFOCUSING PIXELS AND ELECTRONIC APPARATUS INCLUDING THE IMAGE SENSOR

CROSS-REFERENCE TO RELATED APPLICATION

This application is based on and claims priority under 35 U.S.C. § 119 to Korean Patent Application No. 10-2022-0093456, filed on Jul. 27, 2022, in the Korean Intellectual Property Office, the disclosure of which is incorporated by reference herein in its entirety.

BACKGROUND

1. Field

Example embodiments of the present disclosure relate to image sensors and electronic apparatuses including the image sensors.

2. Description of Related Art

An image sensor generally senses a color of incident light by using a color filter. However, because the color filter absorbs light of a color other than the light of the corresponding color, the light utilization efficiency of the image sensor may be reduced. For example, when a red-green-blue (RGB) color filter is used, because only $\frac{1}{3}$ of incident light is transmitted and the remaining $\frac{2}{3}$ is absorbed, the light utilization efficiency of the image sensor is only about 33%. Most light loss of an image sensor is caused by a color filter. Accordingly, a method of separating a color into each pixel of an image sensor without using a color filter has been attempted.

On the other hand, as the demand for image sensors of high resolution increases, the pixel size has been gradually decreased, which may limit the color separation function. In addition, because in the color separation method energy entering a unit pixel is divided and absorbed into R, G, and B effective areas, each sub-pixel is responsible for one color, and resolution degradation may occur due to under-sampling, which may be present in signal processing. Accordingly, a method of implementing full color pixels suitable for high resolution implementation is needed.

SUMMARY

Example embodiments provide image sensors having a full color pixel and an auto-focusing pixel and electronic apparatuses including the image sensors.

Additional aspects will be set forth in part in the description which follows and, in part, will be apparent from the description, or may be learned by practice of the example embodiments of the disclosure.

According to an aspect of an example embodiment, there is provided an image sensor including a pixel array including a plurality of imaging pixels and a plurality of autofocusing pixels, and a lens array including a plurality of micro lenses facing the plurality of imaging pixels, respectively, and one or more super lenses facing the plurality of autofocusing pixels, wherein each imaging pixel of the plurality of imaging pixels includes a first red meta-photodiode configured to selectively absorb light of a red wavelength band, a first green meta-photodiode configured to selectively absorb light of a green wavelength band, and a first blue meta-photodiode configured to selectively absorb light of a blue wavelength band.

Each autofocusing pixel of the plurality of autofocusing pixels may include a second red meta-photodiode configured to selectively absorb light of the red wavelength band, a second green meta-photodiode configured to selectively absorb light of the green wavelength band, and a second blue meta-photodiode configured to selectively absorb light of the blue wavelength band.

An arrangement of the first red meta-photodiode, the first green meta-photodiode, and the first blue meta-photodiode included in each imaging pixel of the plurality of imaging pixels may be same as an arrangement of the second red meta-photodiode, the second green meta-photodiode, and the second blue meta-photodiode included in each autofocusing pixel of the plurality of autofocusing pixels.

The first red meta-photodiode, the first green meta-photodiode, and the first blue meta-photodiode included in each imaging pixel of the plurality of imaging pixels may not be symmetrically provided, and the second red meta-photodiode, the second green meta-photodiode, and the second blue meta-photodiode included in each autofocusing pixel of the plurality of autofocusing pixels may be symmetrically provided.

Each of the plurality of autofocusing pixels may include a photodetector.

Each of the plurality of micro lenses and the one or more super lenses included in the lens array may be a refractive lens having a curved surface or a meta lens including a plurality of nanostructures.

Each of the one or more super lenses may have a shape corresponding to $M^2$ autofocusing pixels provided in M×M arrangement, where M is an integer greater than or equal to 2.

Each of the one or more super lenses may have a shape corresponding to N autofocusing pixels provided in 1×N or N×1 arrangement, where N is an integer greater than or equal to 2.

Each of the one or more super lenses may have a shape corresponding to a plurality of autofocusing pixels in a cross shape.

A width of each imaging pixel of the plurality of imaging pixels may be less than or equal to a diffraction limit.

A width of each imaging pixel of the plurality of imaging pixels may be greater than or equal to 0.25 μm and less than or equal to 0.45 μm.

The first red meta-photodiode, the first green meta-photodiode, and the first blue meta-photodiode may include, respectively, a first conductivity type semiconductor layer, an intrinsic semiconductor layer, and a second conductivity type semiconductor layer provided in a first direction, and a first width of a cross-section of the first red meta-photodiode perpendicular to the first direction, a second width of a cross-section of the first green meta-photodiode perpendicular to the first direction, and a third width of the first blue meta-photodiode perpendicular to the first direction may be different from each other.

The first width may be greater than the second width, and the second width may be greater than the third width.

A number of first red meta-photodiodes, including the first red meta-photodiode, included in one imaging pixel of the plurality of imaging pixels may be one, a number of first green meta-photodiodes, including the first green meta-photodiode, included in the one imaging pixel is one, a number of first blue meta-photodiodes, including the first blue meta-photodiode, included in the one imaging pixel may be two, and the first red meta-photodiodes, the first green meta-photodiodes, and the first blue meta-photodiodes are provided such that a line connecting centers of the four meta-photodiodes may form a square.

The two first blue meta-photodiodes may be provided in a diagonal direction of the square.

A number of first red meta-photodiodes, including the first red meta-photodiode, included in one imaging pixel of the plurality of imaging pixels may be one, a number of first green meta-photodiodes, including the first green meta-photodiode, and a number of the first blue meta-photodiodes, including the first blue meta-photodiode, included in the one imaging pixel may be greater than one, respectively, and the first red meta-photodiode may be provided at a center of the one imaging pixel.

The first green meta-photodiodes and the first blue meta-photodiodes may be provided adjacent to the first red meta-photodiode in a square shape or regular hexagonal shape.

Each of the plurality of imaging pixels may further include an infrared meta-photodiode configured to selectively absorb light of an infrared wavelength band.

According to another aspect of an example embodiment, there is provided an electronic apparatus including a lens assembly including one or more lenses, the lens assembly being configured to form an optical image of an object, an image sensor configured to convert the optical image formed by the lens assembly into an electrical signal, and a processor configured to process the electrical signal generated by the image sensor, wherein the image sensor includes a pixel array including a plurality of imaging pixels and a plurality of autofocusing pixels, and a lens array including a plurality of micro lenses facing the plurality of imaging pixels, respectively, and one or more super lenses each facing the plurality of autofocusing pixels, wherein each imaging pixel of the plurality of imaging pixels includes a red meta-photodiode configured to selectively absorb light of a red wavelength band, a green meta-photodiode configured to selectively absorb light of a green wavelength band, and a blue meta-photodiode configured to selectively absorb light of a blue wavelength band.

The processor may be further configured to generate an autofocusing driving signal from an electrical signal corresponding to the plurality of autofocusing pixels, and wherein one of the one or more lenses included in the lens assembly may be configured to move based on the autofocusing driving signal.

BRIEF DESCRIPTION OF THE DRAWINGS

The above and other aspects, features, and advantages of certain example embodiments of the disclosure will be more apparent from the following description taken in conjunction with the accompanying drawings, in which.

Figure 3:
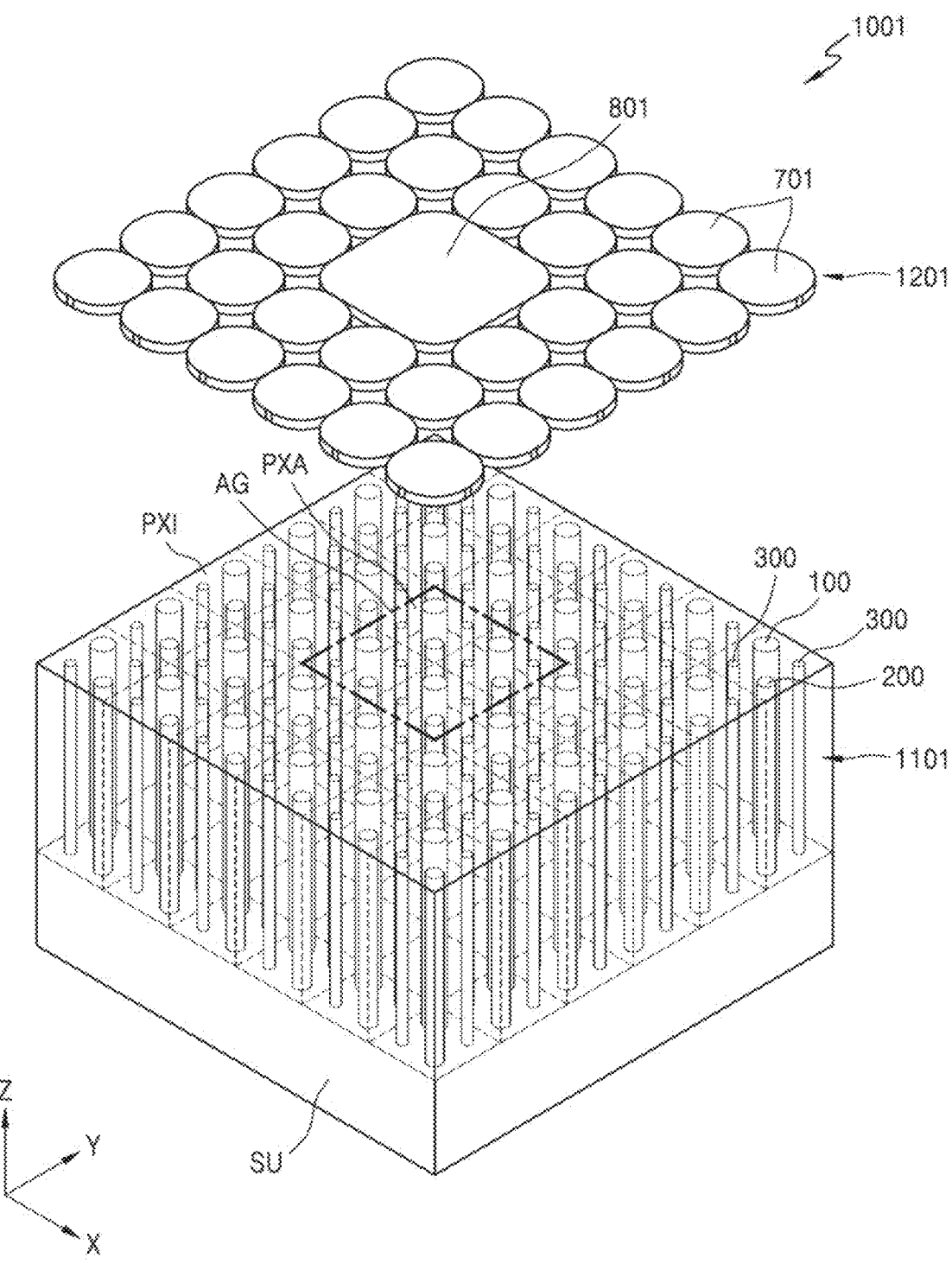
FIG. 3 is a detailed exploded perspective view illustrating a structure of an image sensor according to an example embodiment.
Figure 7:
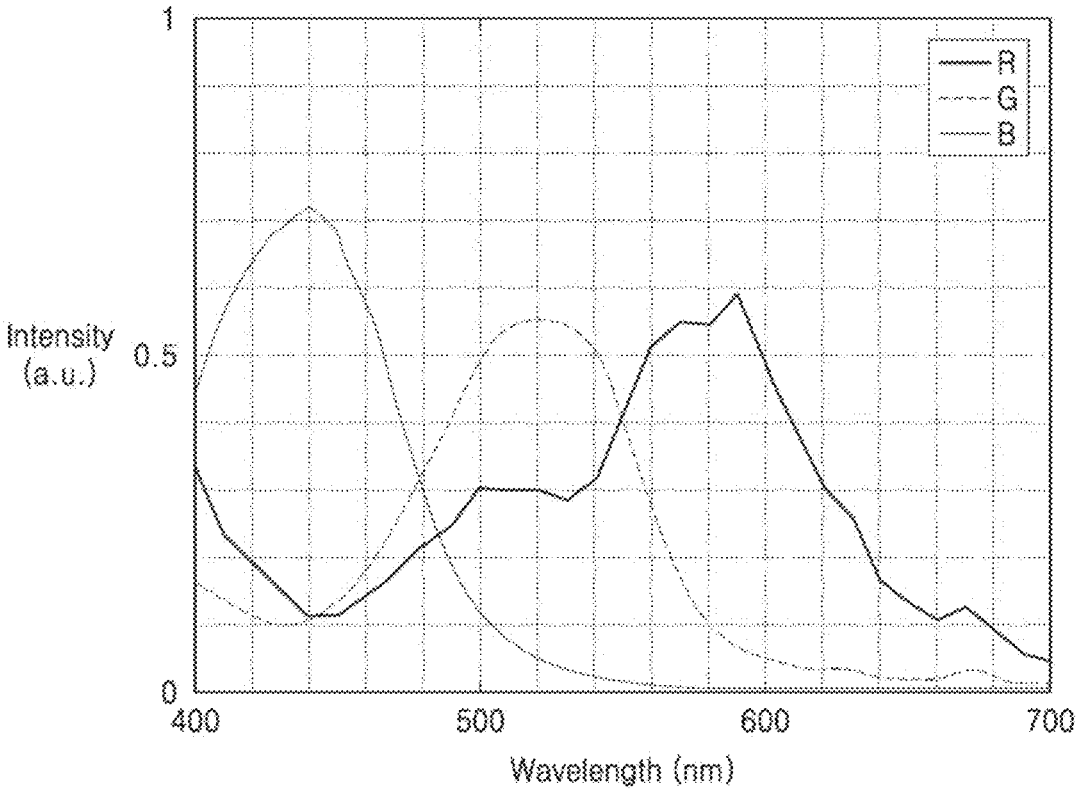
Figure 9:
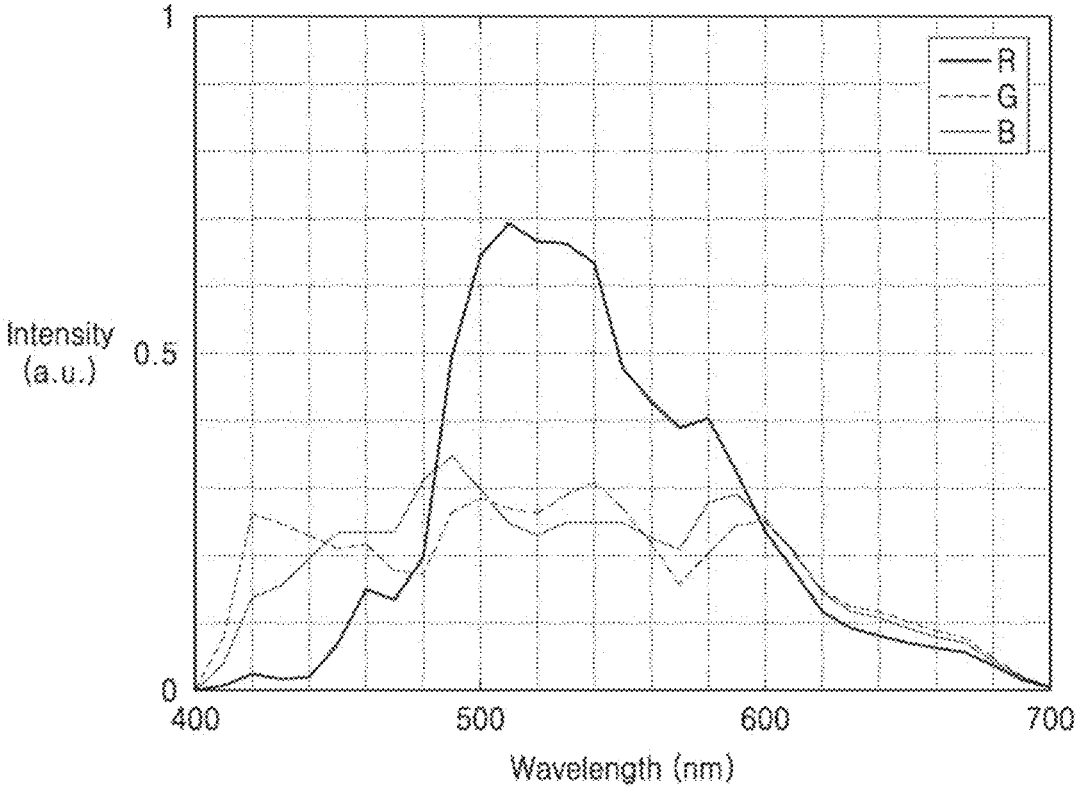
Figure 10:
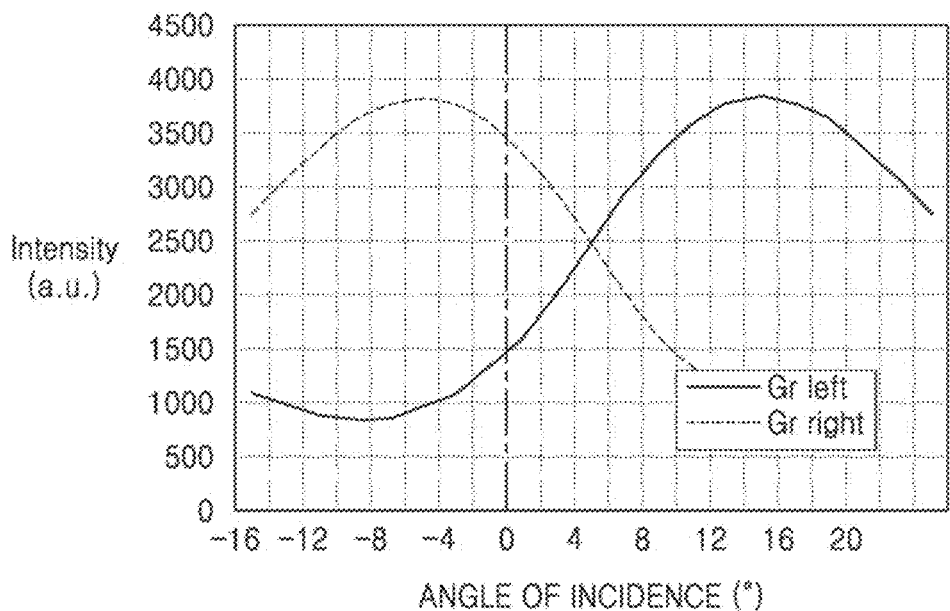
Figure 11:
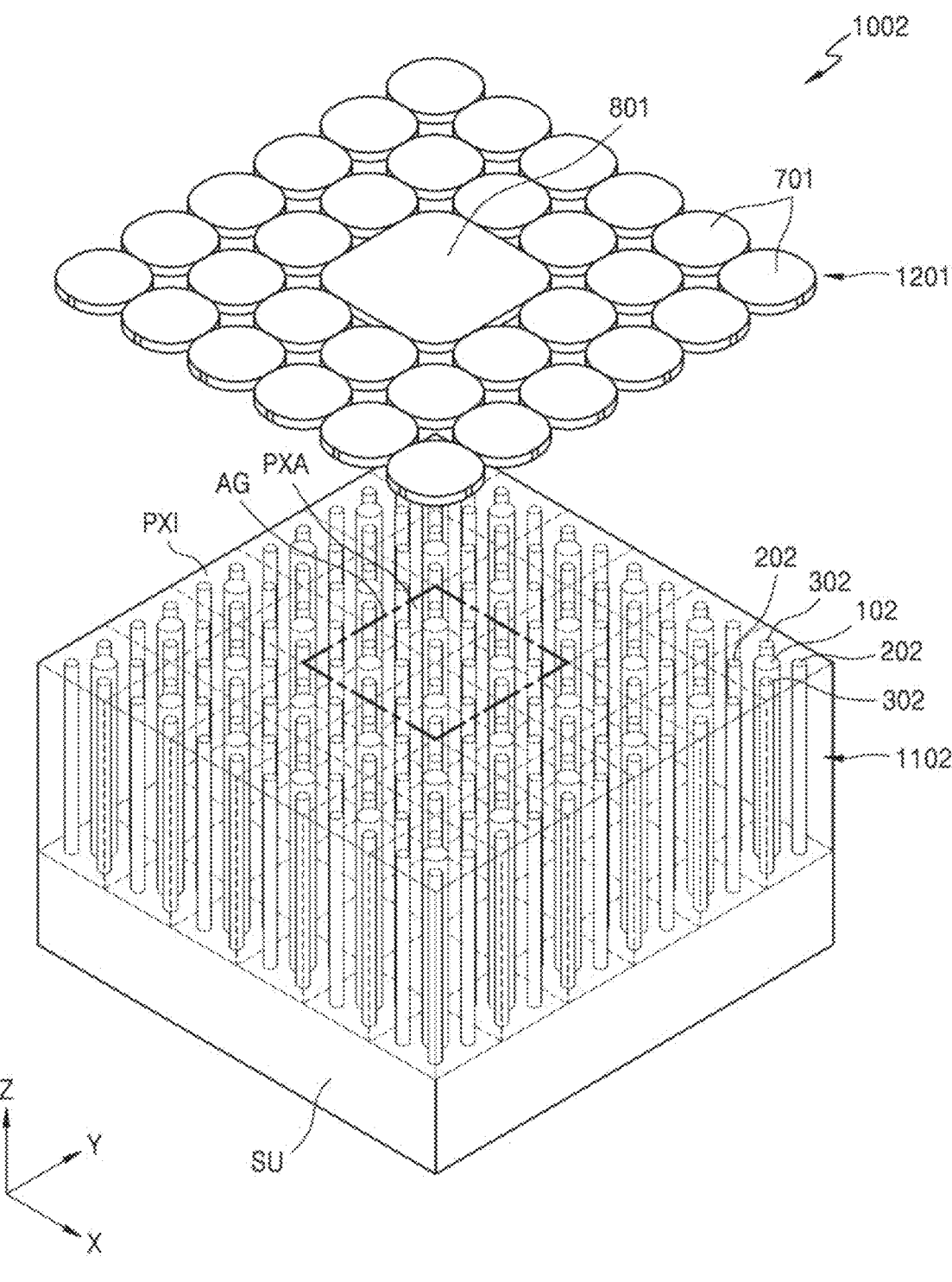
Figure 12:
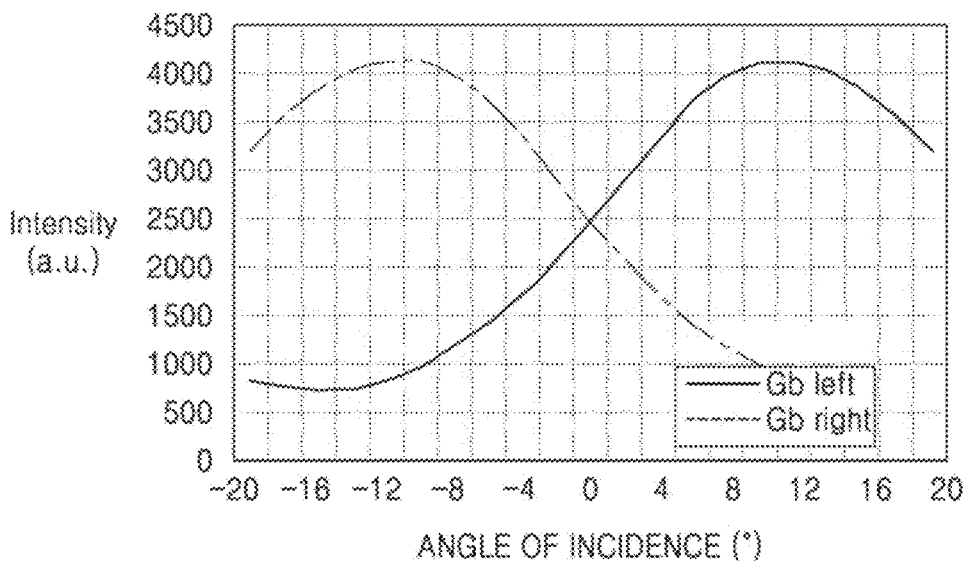
Figure 16:
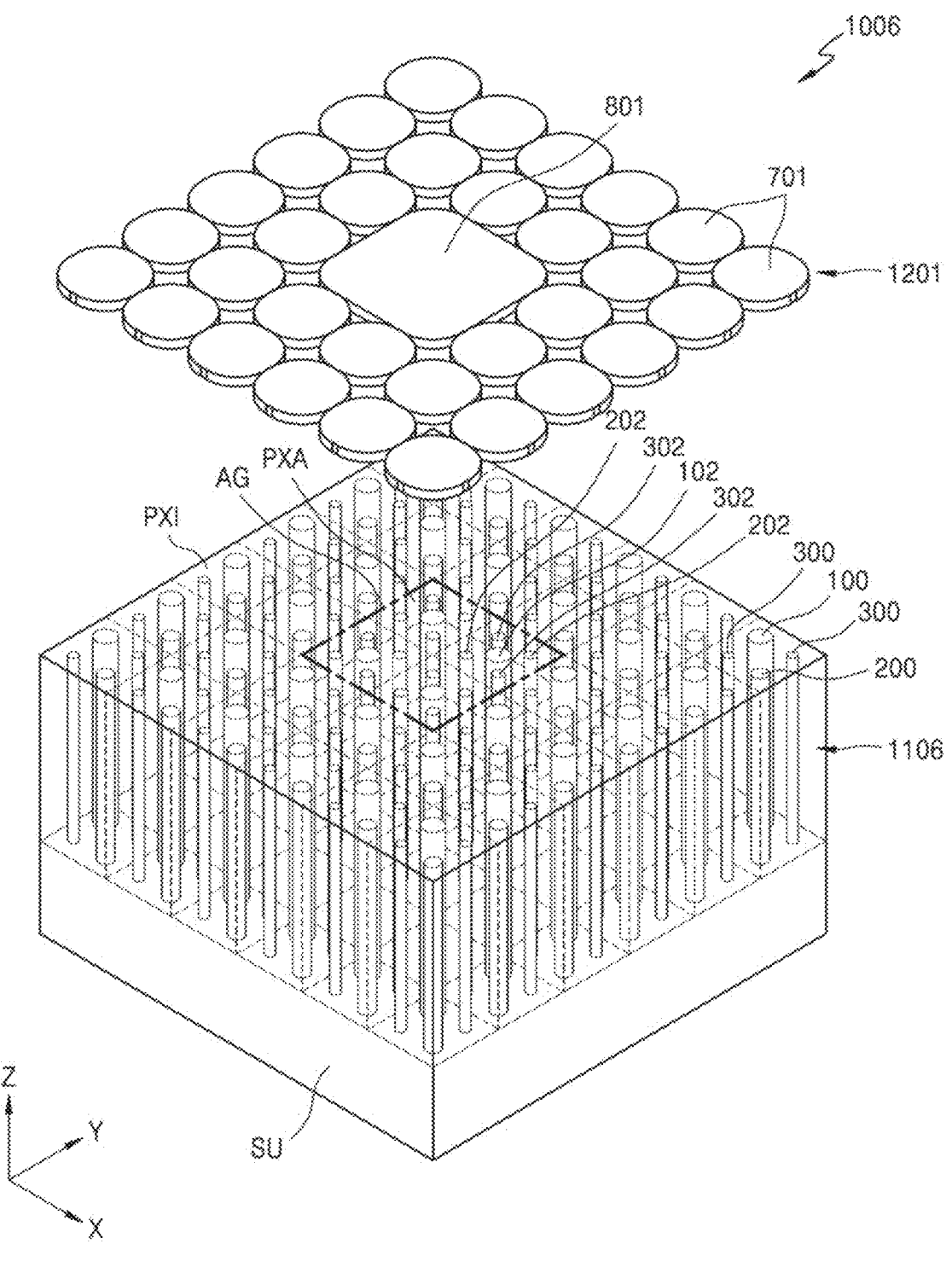
Figure 17:
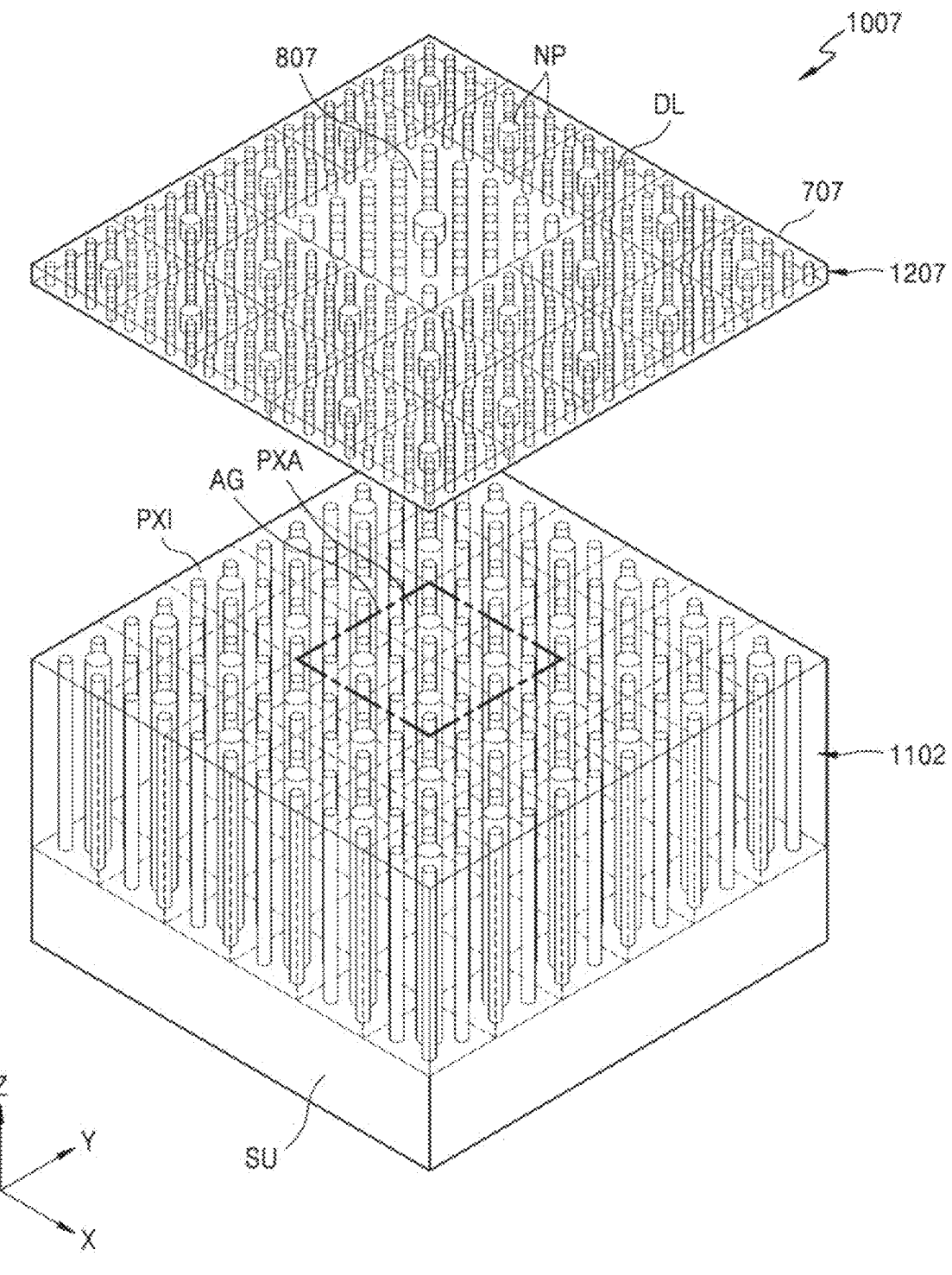
Figure 18A:
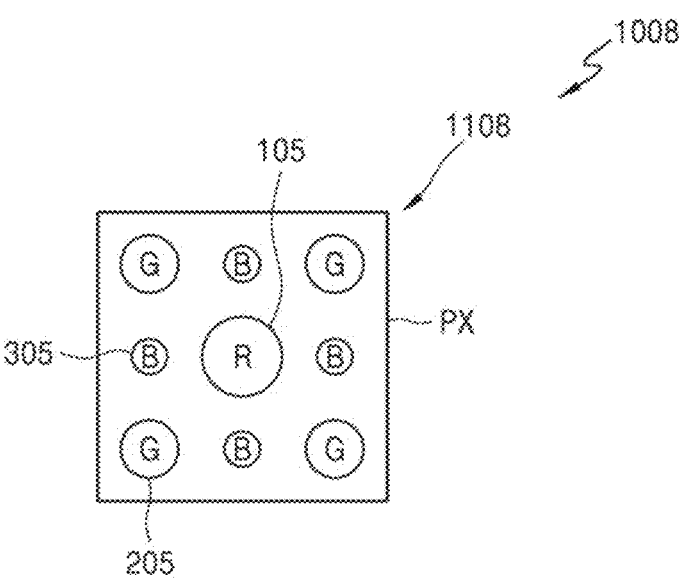
Figure 18B:
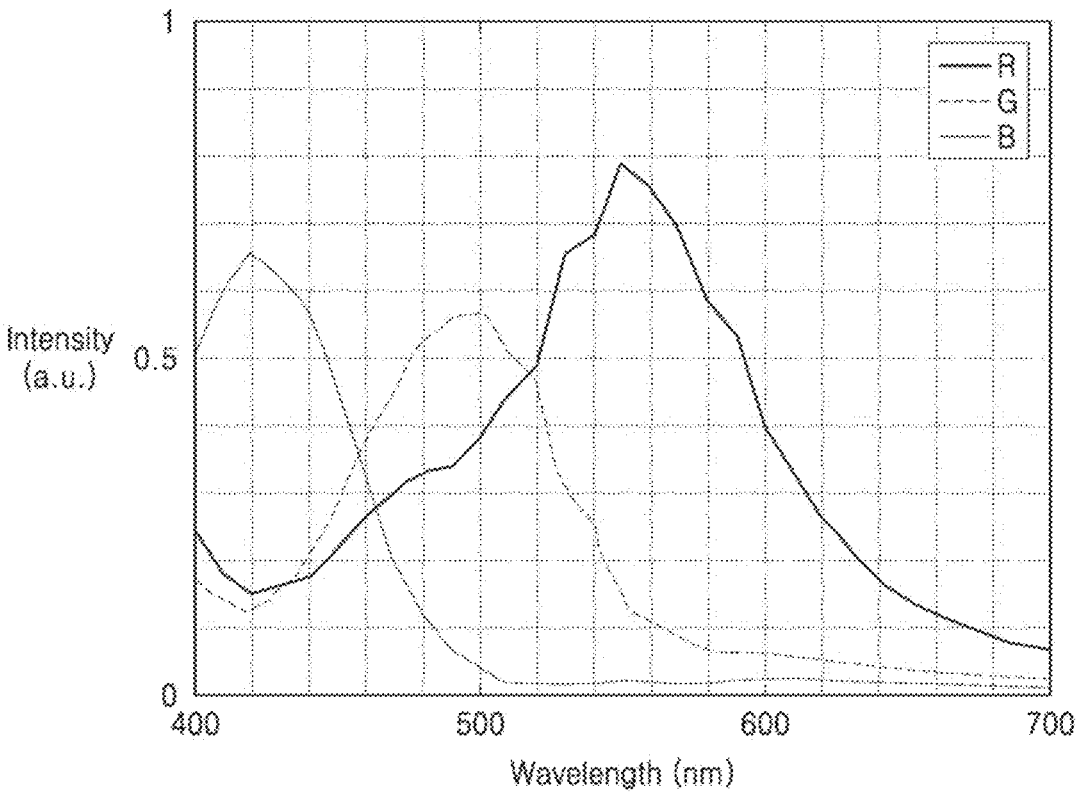
Figure 23:
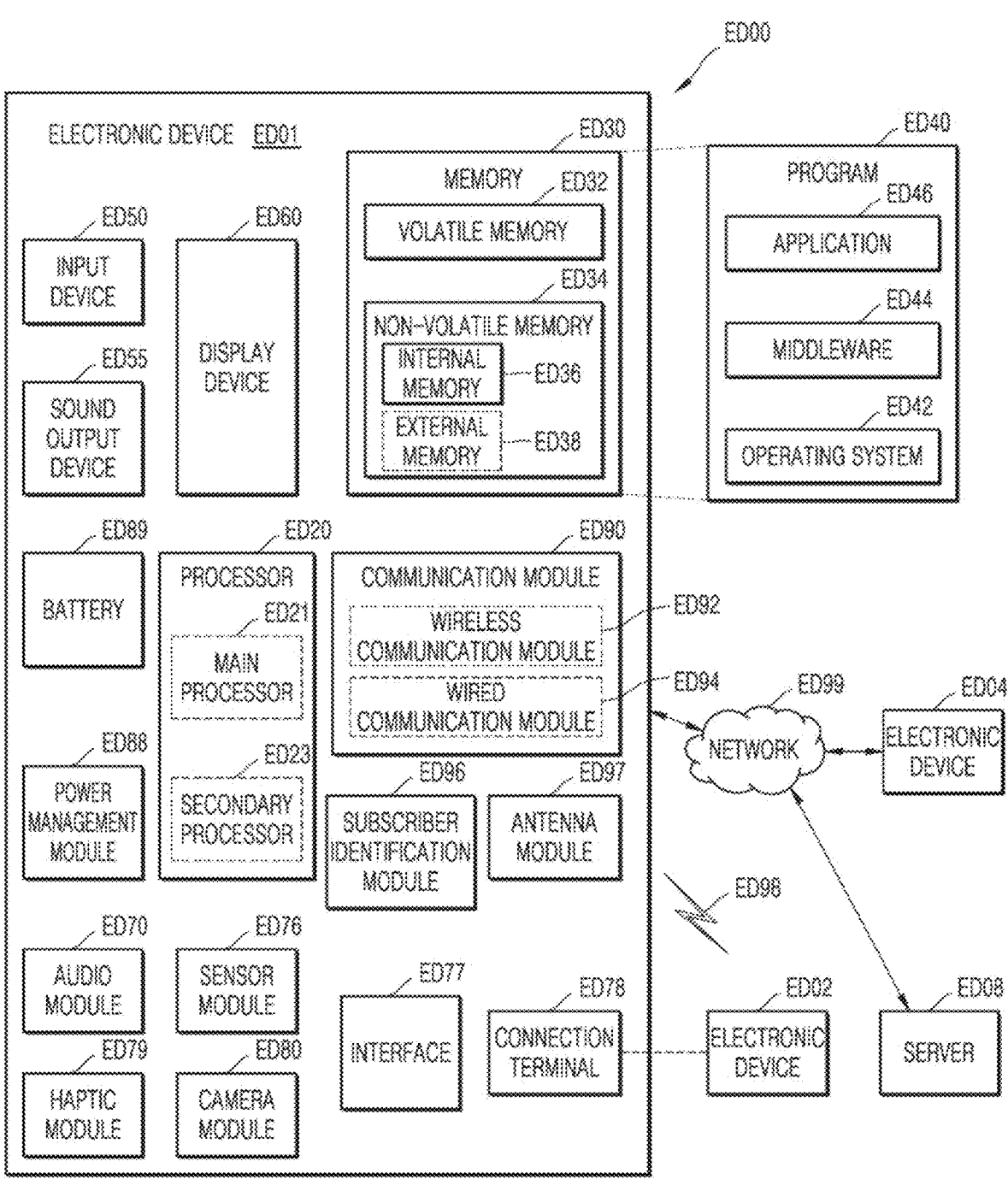
Figure 24:
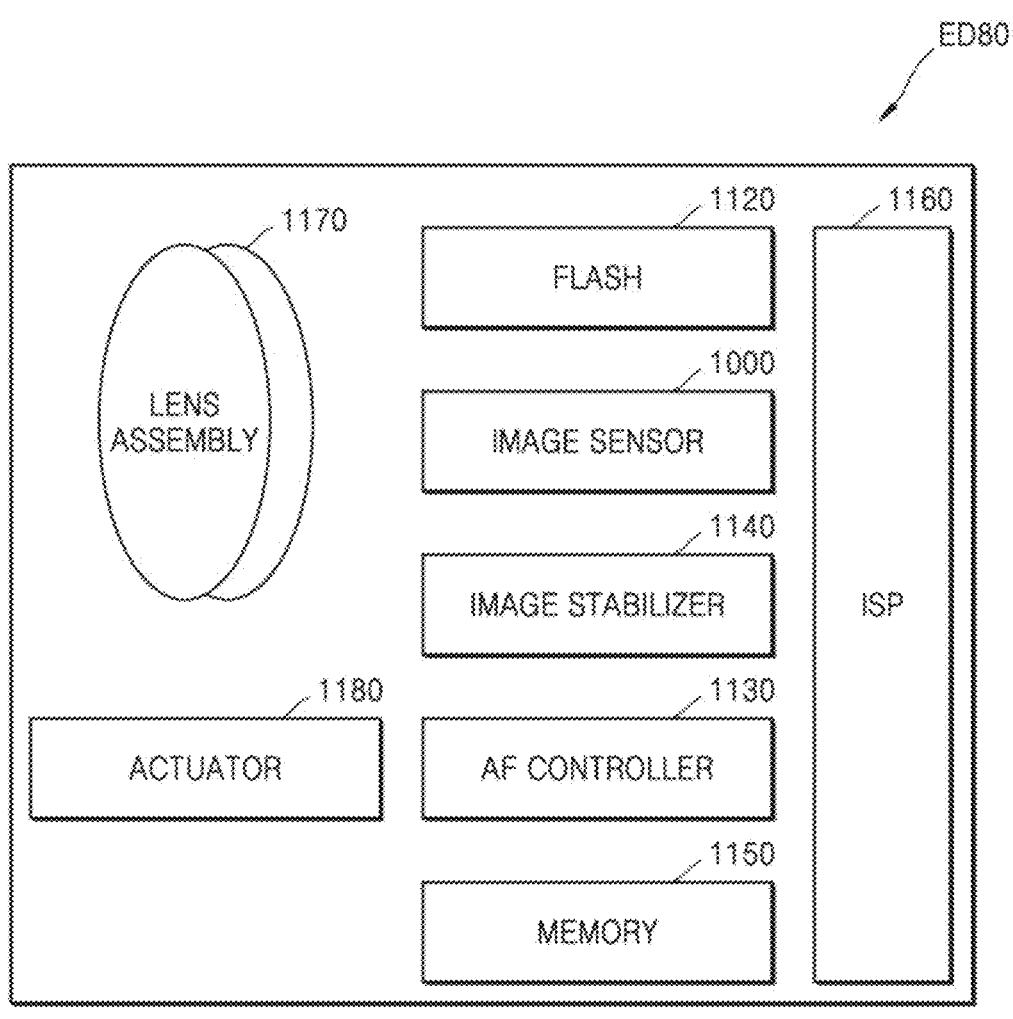

4 sensor according to an example embodiment is absorbed by different meta-photodiodes according to color;

FIG. 7 is a graph illustrating the efficiency for each color of an image sensor according to an example embodiment;

Figure 8:
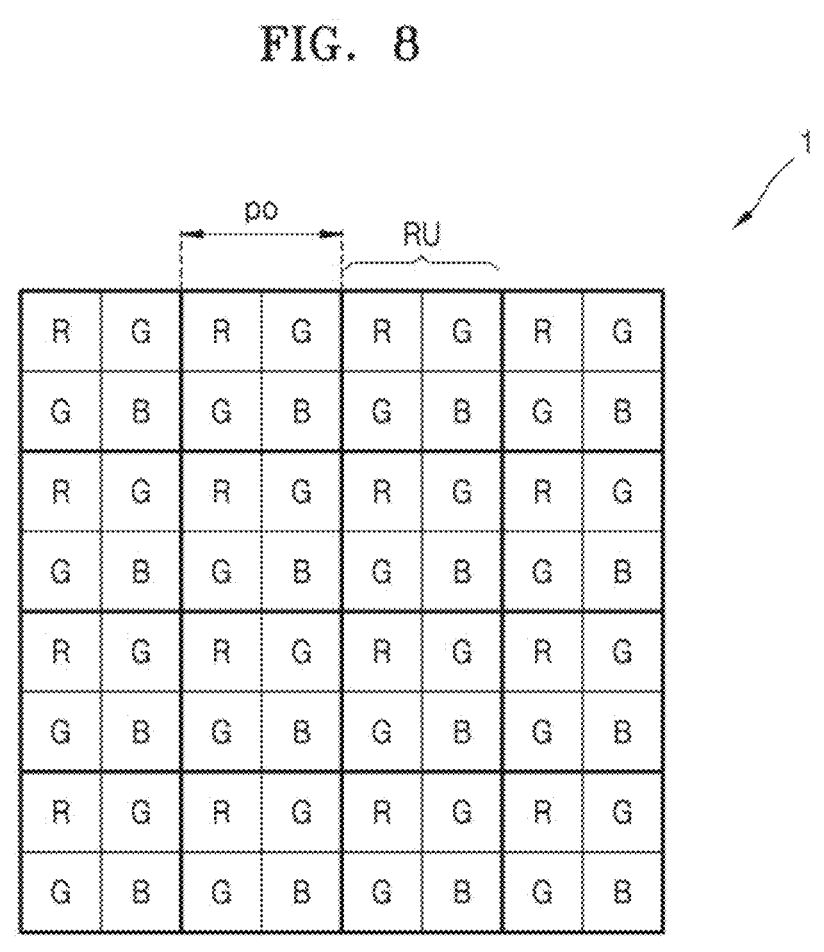

FIG. 8 shows a pixel arrangement of an image sensor according to a related example;

FIG. 9 is a graph illustrating the efficiency for each color of an image sensor according to a related example;

FIG. 10 illustrates a sensitivity characteristic curve extracted from an AF pixel group of the image sensor of FIG. 3;

FIG. 11 is a detailed exploded perspective view illustrating a structure of an image sensor according to an example embodiment;

FIG. 12 illustrates a sensitivity characteristic curve extracted from an AF pixel group of the image sensor of FIG. 11;

FIGS. 13, 14A, 14B, and 15 are perspective views illustrating image sensors according to various example embodiments;

FIGS. 16 and 17 are exploded perspective views illustrating image sensors according to various example embodiments;

FIG. 18A illustrates another example of a pixel structure that may be applied to an image sensor according to an example embodiment, and FIG. 18B is a graph illustrating the efficiency for each color of the image sensor of FIG. 18A, FIGS. 19, 20, 21, and 22 are plan views illustrating pixel arrays of image sensors according to some example embodiments;

FIG. 23 is a block diagram of an electronic apparatus including an image sensor according to some example embodiments;

FIG. 24 is a block diagram illustrating a camera module included in the electronic apparatus of FIG. 23; and FIGS. 25, 26, 27, 28, 29, 30, 31, 32, 33, and 34 are diagrams illustrating various examples of electronic apparatuses to which image sensors according to example embodiments are applied.

DETAILED DESCRIPTION

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereafter, the disclosure will be described more fully with reference to the accompanying drawings. The embodiments of the disclosure are capable of various modifications and may be embodied in many different forms. In the drawings, like reference numerals refer to like elements, and the size of each component may be exaggerated for clarity and convenience of explanation.

Hereinafter, when an element or layer is referred to as being "on" or "above" another element or layer, the element or layer may be directly on another element or layer or intervening elements or layers.

Although the terms "first", "second", etc. may be used herein to describe various elements, but these terms are only used to distinguish one element from another. These terms do not limit the difference in materials or structures of the constituent elements.

In the following descriptions, the singular forms include the plural forms unless the context clearly indicates otherwise. When a part "comprises" or "includes" an element in the specification, unless otherwise defined, it is not excluding other elements but may further include other elements.

Also, in the specification, the term "units" or " . . . modules" denote units or modules that process at least one function or operation, and may be realized by hardware, software, or a combination of hardware and software.

The term "above" and similar directional terms may be applied to both singular and plural.

Operations of all methods described herein may be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

Figure 1:
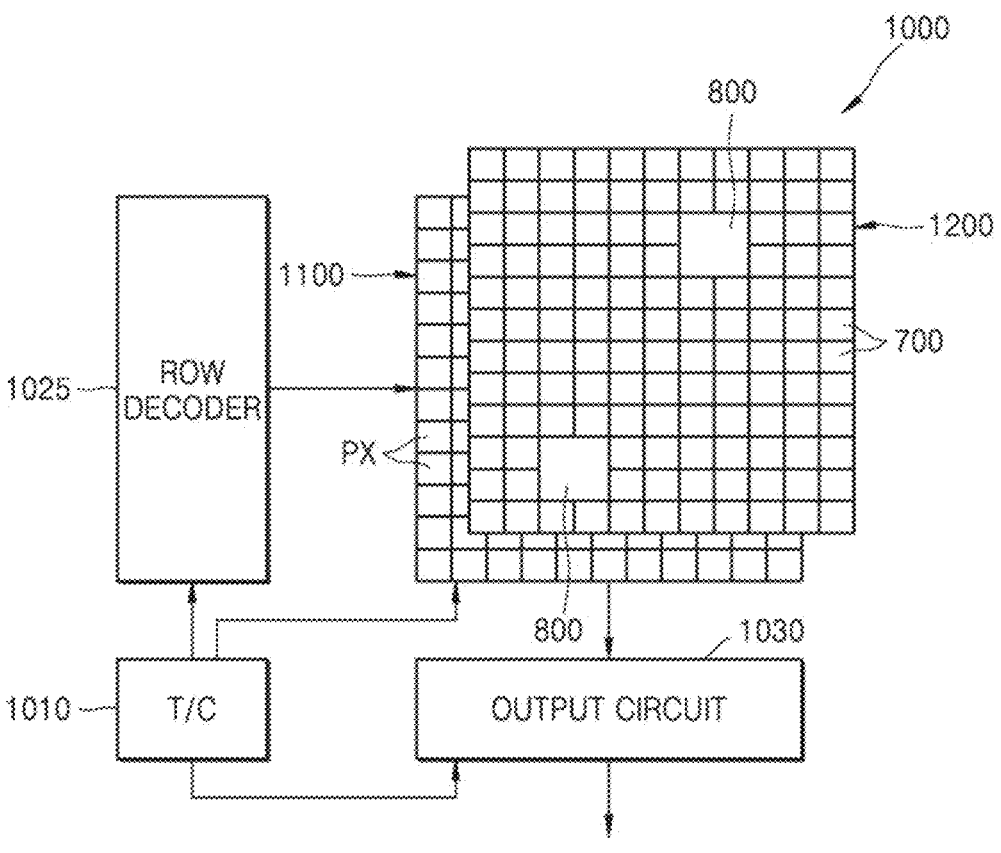
FIG. 1 is a block diagram of an image sensor according to an example embodiment.
Figure 2A:
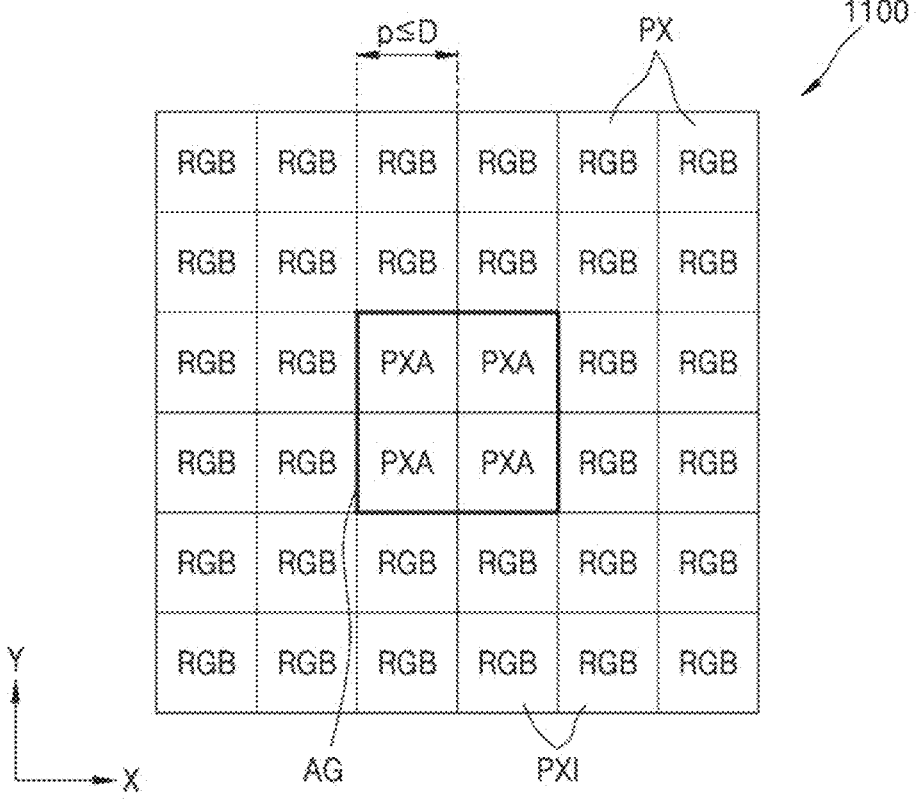
FIGS. 2A and 2B are plan views illustrating a pixel array and a lens array of the image sensor of FIG. 1.
Figure 2B:
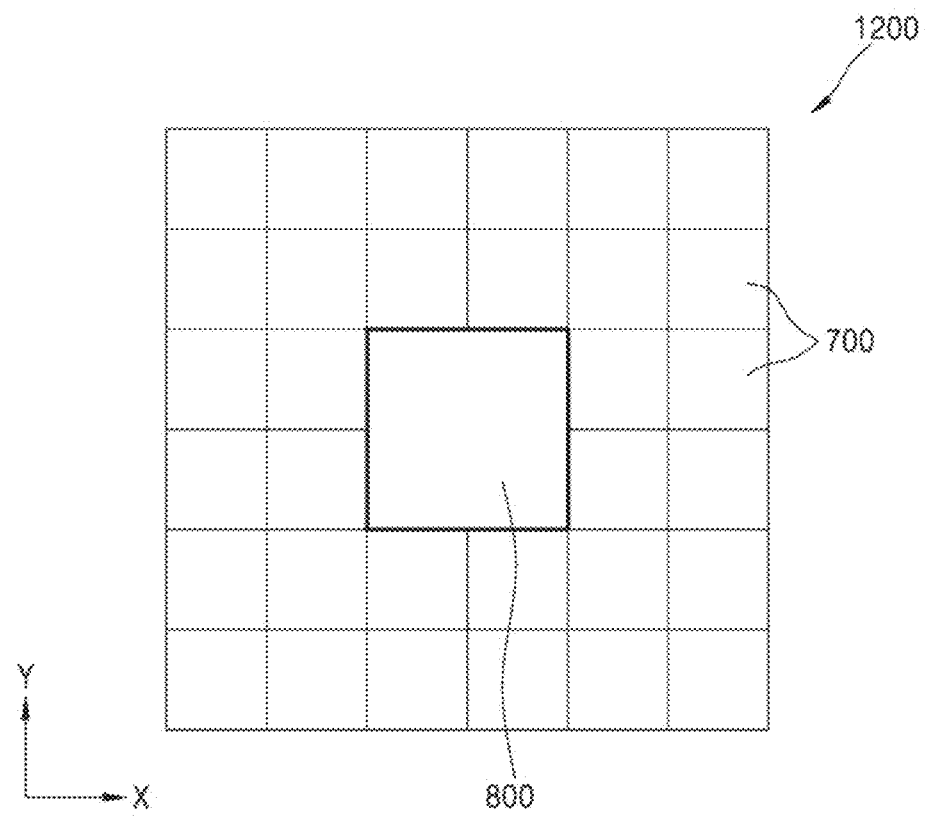

FIG. 1 is a block diagram of an image sensor according to an example embodiment. FIGS. 2A and 2B are plan views illustrating a pixel array and a lens array of the image sensor of FIG. 1.

Referring to FIG. 1, an image sensor 1000 includes a pixel array 1100. The image sensor 1000 may further include a timing controller 1010, a row decoder 1020, and an output circuit 1030. The image sensor 1000 may further include a lens array 1200 disposed to face the pixel array 1100.

The pixel array 1100 includes a plurality of pixels PXs each independently sensing light. The plurality of pixels PX may be two-dimensionally arranged along a plurality of rows and columns.

The row decoder 1020 selects one row from among rows of the pixel array 1100 in response to a row address signal output from the timing controller 1010. The output circuit 1030 outputs a photo-sensing signal in column units from a plurality of pixels arranged along the selected row. To this end, the output circuit 1030 may include a column decoder and an analog-to-digital converter (ADC). For example, the output circuit 1030 may include a plurality of ADCs respectively disposed for columns between the column decoder and the pixel array 1100, or one ADC disposed at an output terminal of the column decoder. The timing controller 1010, the row decoder 1020, and the output circuit 1030 may be implemented as a single chip or as separate chips. A processor for processing an image signal output by the output circuit 1030 may be implemented as a single chip together with the timing controller 1010, the row decoder 1020, and the output circuit 1030.

As shown in FIG. 2A, the plurality of pixels PX constituting the pixel array 1100 may be divided into an imaging pixel PXI and an autofocusing pixel PXA. Most of the plurality of pixels PX are used as imaging pixels PXI for image acquisition. Some of the plurality of pixels PX are used as autofocusing pixels PXA used to generate signals for autofocus driving, that is, autofocus control. The autofocusing pixel PXA may also serve as the imaging pixel PXI. Hereinafter, the pixel PX may collectively refer to the imaging pixel PXI and the autofocusing pixel PXA, or may refer to only the imaging pixel PXI, which will be clear from the context.

The imaging pixels PXI are full-color pixels each sensing an arbitrary color. For example, light incident on the imaging pixel PXI may be sensed separately for each wavelength band, for example, amounts of a red light component, a green light component, and a blue light component. Accordingly, the loss of light of a specific color according to a color of a sub-pixel, which occurs in an image sensor having a color filter of the related art, does not occur in the image sensor 1000 of the present embodiment. In other words, each color component of light incident on the imaging pixel PXI may be detected almost regardless of a position of a region within the imaging pixel PXI. In this regard, the imaging pixel PXI of the image sensor 1000 according to the present embodiment may be referred to as a full-color pixel or an RGB pixel in a sense of distinguishing from a red pixel, a green pixel, a blue pixel, etc., which recognize only specific colors.

Similar to the imaging pixel PXI, the autofocusing pixel PXA may be a full color pixel, or may be a pixel that senses light without distinguishing a wavelength, that is, a pixel without wavelength selectivity. When the autofocusing pixel PXA is a full color pixel, like the imaging pixel PXI, the autofocusing pixel PXA may also be utilized as the imaging pixel PXI. A plurality of adjacent autofocusing pixels PXA may be configured to form one group. For example, as shown in FIG. 2A, four autofocusing pixels PXA arranged adjacently in 2×2 may form an AF pixel group AG. For autofocus driving, a signal sum by the left two autofocusing pixels PXA may be compared with a signal sum by the right two autofocusing pixels PXA in the AF pixel group AG. Whether focusing may be determined according to difference between the two compared signal sums, and a difference value may be an autofocusing driving signal. For example, one lens of lens assemblies included in a camera module including the image sensor 1000 may be driven according to an autofocusing driving signal. According to another example embodiment, image processing such as compensation for images acquired from the imaging pixels PXI may be performed according to an autofocusing driving signal.

The pixels PX may be two-dimensionally arranged. A width p of the pixel PX has a size equal to or less than a diffraction limit D. Here, the width p may denote a width in one direction defining a two-dimensional array, and widths in both directions may be equal to or less than the diffraction limit D. As illustrated, the arrangement of the pixels PX may be a two-dimensional arrangement in two orthogonal directions or may be a hexagonal grid arrangement. In this case, the width p of the pixel PX may be defined as the diagonal length of a hexagon.

The diffraction limit D may be a minimum size to which an object can be imaged discriminatively, and is expressed by the following equation.

$$D=\lambda/(2NA)=\lambda\cdot F$$

Here, λ denotes a wavelength, and NA denotes a numerical aperture of an imaging optical system, and F denotes an F-number of an imaging optical system.

NA is defined as a sine value of an edge ray angle in an imaging space, and the larger the NA, the larger the angular distribution of focused light. F-number is defined by a relation of 1/(2NA). According to a trend towards high resolution and miniaturization of imaging systems, an edge ray angle tends to increase, and accordingly, modular lenses with a small F-number are being developed. When an F-number that may be reduced is about 1.0, the diffraction limit D becomes A.

Under this condition, the diffraction limit D with respect to a central wavelength of blue light may be expressed as 0.4 µm. That is, each pixel PX constituting the pixel array 1100 may have a size equal to or smaller than 0.45 µm×0.45 µm. However, this value is an example, and a specific size may vary according to an imaging optical system.

The width p of the pixel PX may be, for example, equal to or greater than 0.25 µm, or equal to or greater than 0.3 µm, but is not limited thereto. The width p of the pixel PX of the image sensor 1000 of the example embodiment may be less than or equal to the diffraction limit D, and the upper limit of the width p of the pixel PX is not particularly limited. The minimum width of the pixel PX may be set according to the size and number of p-i-n type meta-photodiodes provided in the pixel PX which will be described below. A detailed structure of the meta-photodiodes included in the pixels PX will be described in detail below in FIG. 3.

A lens array 1200 is disposed on the pixel array 1100. The lens array 1200 may collect light to each pixel PX of the pixel array 1100, and may block energy exchange between adjacent pixels PX of the pixel array 1100 and may increase the light efficiency.

The lens array 1200 includes a plurality of micro lenses 700 one-to-one facing the plurality of imaging pixels PXI, and one or more super lenses 800 each facing the plurality of autofocusing pixels PX. For example, when four autofocusing pixels PXA arranged adjacently in 2×2 form the AF pixel group AG as shown in FIG. 2A, to cover the four autofocusing pixels PXA, a super lens 800 may be provided as shown in FIG. 2B. The super lens 800 has a shape covering the four autofocusing pixels PXA as an example, and may be changed to other numbers. The number of super lenses 800 illustrated in FIG. 1 is also an example.

The image sensor 1000 of the embodiment has a structure in which R, G, and B color information is obtained from a single pixel PX having a size equal to or smaller than the diffraction limit D. Accordingly, it is difficult to use an auto focus method used in the Bayer pattern image sensor or the Foveon image sensor using a stacked photodiode, as in related art. According to an example embodiment, the lens array 1200 may include the micro lens 700 facing the imaging pixel PXI and the super lens 800 facing the AF pixel group AG.

FIG. 2B is a conceptual diagram illustrating the lens array 1200 having a correspondence relationship with the lens array 1200 and the pixel array 1100 of FIG. 2A, and the lens array 1200 is not limited to the illustrated shape. The micro lens 700 serves to collect light to the imaging pixel PXI facing each other. For example, the focus of the micro lens 700 may be formed at the center of the imaging pixel PXI. The super lens 800 may collect light to the AF pixel group AG facing each other. For example, the focus of the super lens 800 may be formed at the center of the AF pixel group AG.

Each of the micro lens 700 and the super lens 800 may be a refractive lens having a material and a curved surface set to have the focal length described above. According to another example embodiment, each of the micro lens 700 and the super lens 800 may be a meta lens having a flat appearance. Each of the micro lens 700 and the super lens 800 may be a meta lens including a plurality of nanostructures each having a shape and arrangement set to have a phase profile suitable for the focal length described above.

The number of AF pixel groups AG, the number of super lenses 800, and the number and arrangement of autofocusing pixels PXA covered by one super lens 800 shown in FIGS. 1, 2A, and 2B are examples, and may be changed in various ways.

Figure 4:
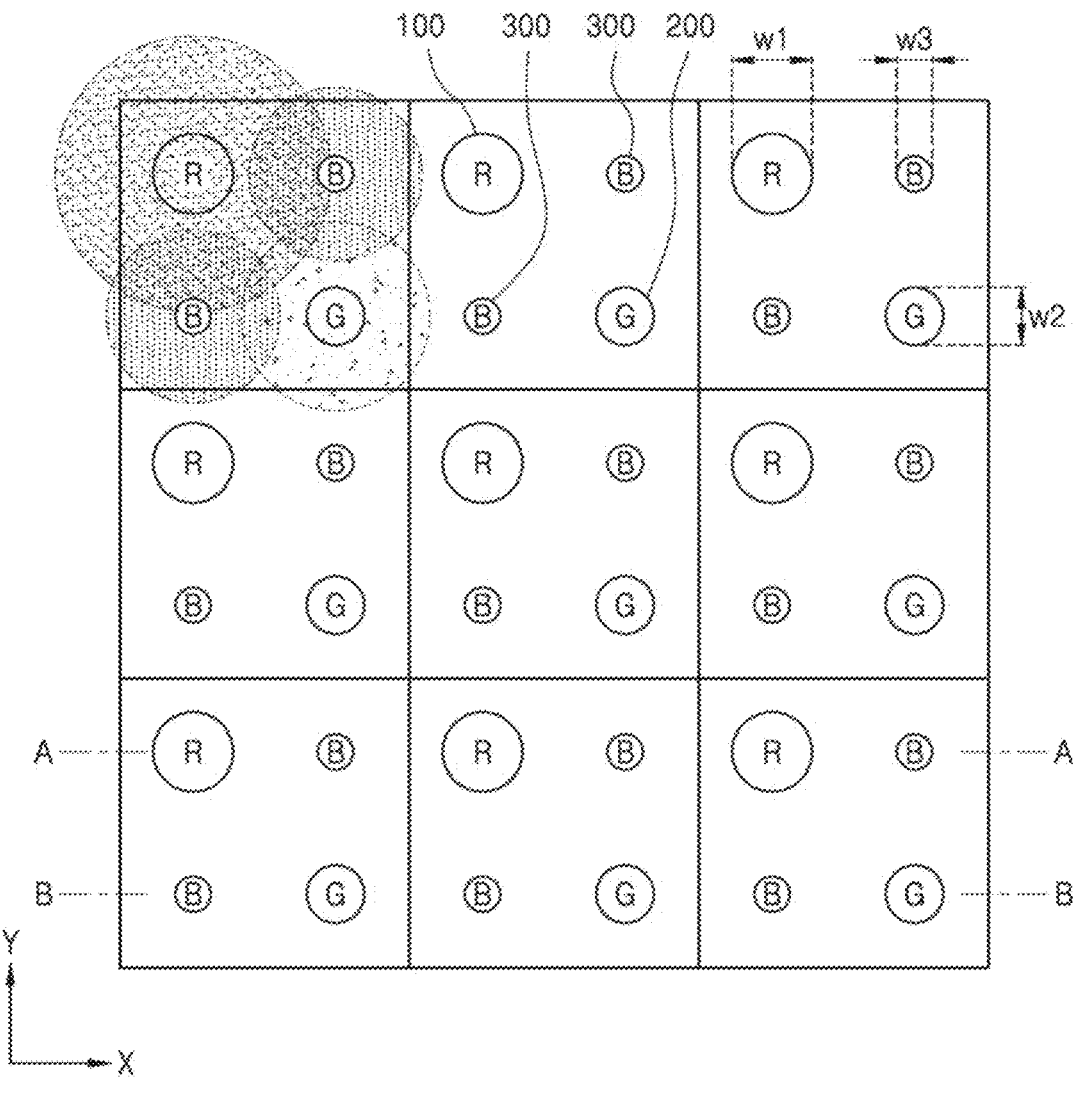
FIG. 4 is a partial plan view of a pixel array of FIG. 3.
Figure 5A:
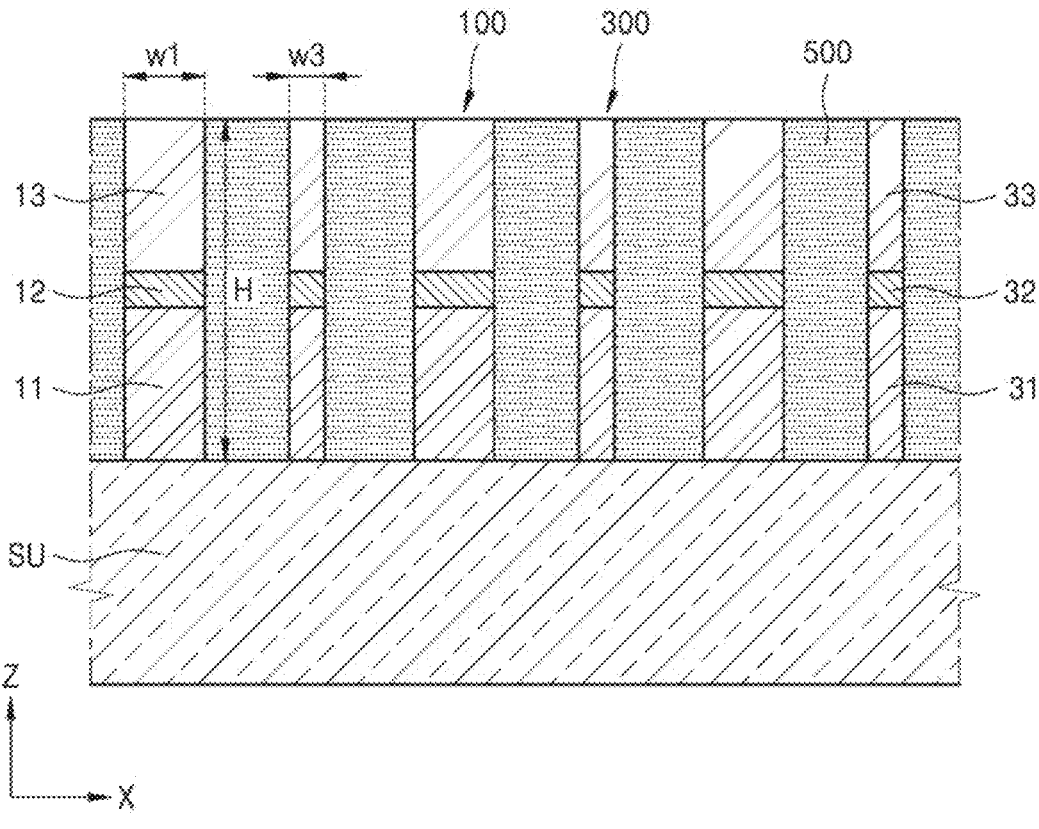
FIGS. 5A and 5B are cross-sectional views taken along lines A-A and B-B of FIG. 3, respectively.
Figure 5B:
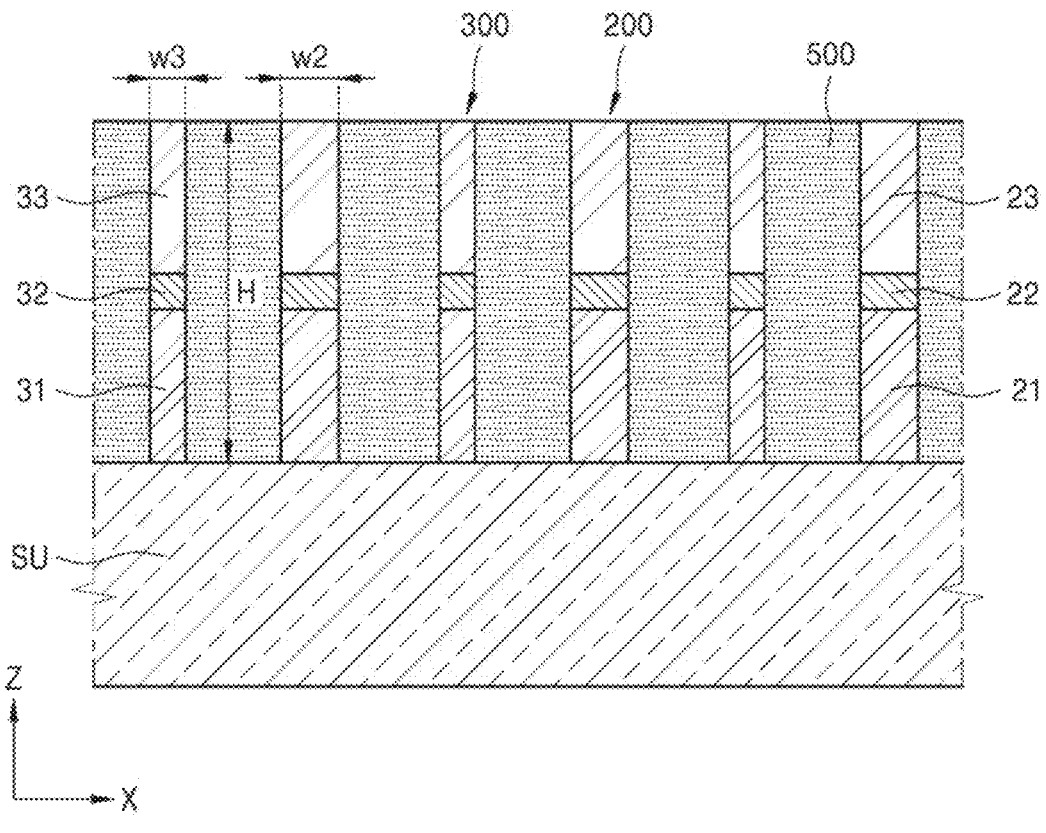

FIG. 3 is a detailed exploded perspective view illustrating a structure of an image sensor according to an example embodiment. FIG. 4 is a partial plan view of a pixel array of FIG. 3. FIGS. 5A and 5B are cross-sectional views taken along lines A-A and B-B of FIG. 3, respectively.

An image sensor 1001 includes a pixel array 1101 including a plurality of imaging pixels PXI and a plurality of autofocusing pixels PXA, and a lens array 1201 disposed on the pixel array 1101. Adjacent autofocusing pixels PXA form the AF pixel group AG.

The lens array 1201 includes a micro lens 701 facing the imaging pixel PXI and a super lens 801 facing the AF pixel group AG. A plurality of micro lenses 701 one-to-one face the plurality of imaging pixels PXI, and the super lens 801 each face the plurality of autofocusing pixels PX. As shown, the super lens 801 may face four autofocusing pixels PX, but is not limited thereto. The micro lens 701 may collect light to the imaging pixel PXI facing each other. For example, the focus of the micro lens 701 may be formed at the center of the imaging pixel PXI. The super lens 801 may collect light to the AF pixel group AG facing each other. For example, the focus of the super lens 801 may be formed at the center or on the central axis of the AF pixel group AG. Each of the micro lens 701 and the super lens 801 is a refractive lens having a curved surface exhibiting a desired refractive power, that is, the focal length described above. The micro lens 701 and the super lens 801 have different effective diameters, and thus, the thickness of the super lens 801 may be thicker than the thickness of the micro lens 701 when each curved surface is designed to have the same or similar focal length. According to another example embodiment, the focal length of each of the super lens 801 and the micro lens 701 may be slightly adjusted so that the thicknesses of the super lens 801 and the micro lens 701 are as similar as possible. In this case, a central portion of the super lens 801 may have a radius of curvature that is larger than a radius curvature of a peripheral portion of the super lens 801, and may be close to a flat shape. The curved surface of each of the super lens 801 and the micro lens 701 may be spherical or aspherical. The super lens 801 and the micro lens 701 may include the same material, and the lens array 1201 may be integrally formed. However, embodiments are not limited thereto.

Each of the plurality of pixels PX, the plurality of imaging pixels PXI and the plurality of autofocusing pixels PXA, constituting the pixel array 1100 includes a red meta-photodiode 100 that selectively absorbs light of a red wavelength band, a green meta-photodiode 200 that selectively absorbs light of a green wavelength band, and a blue meta-photodiode 300 that selectively absorbs light of a blue wavelength band.

Each of the red meta-photodiode 100, the green meta-photodiode 200, and the blue meta-photodiode 300 is a rod-shaped vertical photodiode having a shape dimension smaller than a wavelength of incident light, and may sense light by selectively absorbing light of a specific wavelength band by a resonance based on a waveguide mode and accordingly generating a photoelectric signal. The red meta-photodiode 100, the green meta-photodiode 200, and the blue meta-photodiode 300, respectively, have widths w1, w2, and w3 of cross-sections perpendicular to a length direction thereof, and the widths w1, w2, and w3 are different from each other. The widths w1, w2, and w3 may be, for example, in a range of about 50 nm to about 200 nm. Each of the widths w1, w2, and w3 is set so that light having a wavelength that satisfies each waveguide mode resonance condition among light incident on the pixel PX is guided inside the corresponding photodiode. For example, w1 may be about 100 nm, and may be in a range from about 95 nm to about 105 nm. w2 may be about 85 nm, and may be in a range from about 80 nm to about 90 nm. w3 may be about 60 nm, and may be in a range from about 55 nm to about 65 nm. The red meta-photodiode 100, the green meta-photodiode 200, and the blue meta-photodiode 300 having such widths w1, w2, and w3 may absorb red light, green light, and blue light among incident light, respectively. As shown in FIG. 4, circles shown around the red, green, and blue meta-photodiodes 100, 200, and 300 conceptually indicate that red light, green light, and blue light are guided into the inside of the red, green, and blue meta-photodiodes 100, 200, and 300, respectively, but are not limited thereto. Most of red light incident to an arbitrary position within the pixel PX region may be absorbed by the red meta-photodiode 100, most of green light may be absorbed by the green meta-photodiode 200, and most of blue light may be absorbed by the blue meta-photodiode 300.

A single pixel PX may include one red meta-photodiode 100 that absorbs red light, one green meta-photodiode 200 that absorbs green light, and two blue meta-photodiodes 300 that absorb blue light. The red, green, and blue meta-photodiodes 100, 200, and 300 may be arranged in a form in which a line connecting the centers of the four meta-photodiodes is a square, and the two blue meta-photodiodes 300 may be disposed in a diagonal direction of the square. However, embodiments are not limited thereto.

A height H of each of the red meta-photodiode 100, the green meta-photodiode 200, and the blue meta-photodiode 300 may be equal to or greater than about 500 nm, equal to or greater than about 1 μm μm, or equal to or greater than about 2 μm. The height H may be set considering a position where light incident on the photodiode is absorbed, that is, a depth position from a surface. The position may be set considering computational simulation results of FIGS. 6A to 6C which will be described below. Light with a shorter wavelength having high energy is absorbed closer to an upper surface of the photodiode, and light with a longer wavelength is absorbed at a deeper position of the photodiode. The red meta-photodiode 100, the green meta-photodiode 200, and the blue meta-photodiode 300 may have the same height as shown. When the red, green, and blue meta-photodiodes 100, 200, and 300 have the same height, in general, the manufacturing process may be easier. In this case, a height at which light absorption is sufficiently achieved may be set with respect to light of a long wavelength band. However, embodiments are not limited thereto, and the red meta-photodiode 100, the green meta-photodiode 200, and the blue meta-photodiode 300 may be set to have different heights from each other. For example, a height h1 of the red meta-photodiode 100, a height h2 of the green meta-photodiode 200, and a height h3 of the blue meta-photodiode 300 may satisfy h1>h2>h3.

Referring to FIGS. 5A and 5B, the red, green, and blue meta-photodiodes 100, 200, and 300 may be pin photodiodes in a rod shape. The red meta-photodiode 100 may include a first conductivity type semiconductor layer 11, an intrinsic semiconductor layer 12, and a second conductivity type semiconductor layer 13. The green meta-photodiode 200 may include a first conductivity type semiconductor layer 21, an intrinsic semiconductor layer 22, and a second conductivity type semiconductor layer 23, and the blue meta-photodiode 300 may include a first conductivity type semiconductor layer 31, an intrinsic semiconductor layer 32, and a second conductivity type semiconductor layer 33. The red, green, and blue meta-photodiodes 100, 200, and 300 are illustrated in a cylindrical shape, but are not limited thereto. For example, the red, green, and blue meta-photodiodes 100, 200, and 300 may have a polygonal column shape, such as a square column or a hexagonal column.

The red, green, and blue meta-photodiodes 100, 200, and 300 may include a silicon-based semiconductor. For example, the first conductivity type semiconductor layers 11, 21, and 31 may include p-Si, the intrinsic semiconductor layers 12, 22, and 32 may include i-Si, and the second conductivity type semiconductor layers 13, 23, and 33 may include n-Si. The first conductivity type semiconductor layers 11, 21, and 31 may include n-Si, and the second conductivity type semiconductor layers 13, 23, and 33 may include p-Si.

A peripheral material 500 of each of the red, green, and blue meta-photodiodes 100, 200, and 300 may be air, or may be a material having a refractive index less than that of each of the red, green, and blue meta-photodiodes 100, 200, and 300. For example, silicon oxide ($SiO_2$), silicon nitride ($Si_3N_4$), or aluminum oxide ($Al_2O_3$) may be used as the peripheral material 500.

A circuit board SU supports the plurality of red, green, and blue meta-photodiodes 100, 200, and 300, and may include a circuit element configured to process signals from each pixel PX. For example, electrodes and wiring structures for the red, green, and blue meta-photodiodes 100, 200, and 300 provided in the pixel PX may be provided in the circuit board SU. In addition, various circuit elements necessary for the image sensor 1000 may be integrated and disposed in the circuit board SU. For example, a logic layer including various analog circuits and digital circuits, and a memory layer in which data is stored may be provided in the circuit board SU. The logic layer and the memory layer may be configured as different layers or the same layer. Some of the circuit elements illustrated in FIG. 1 may be provided in the circuit board SU.

Figure 6A:
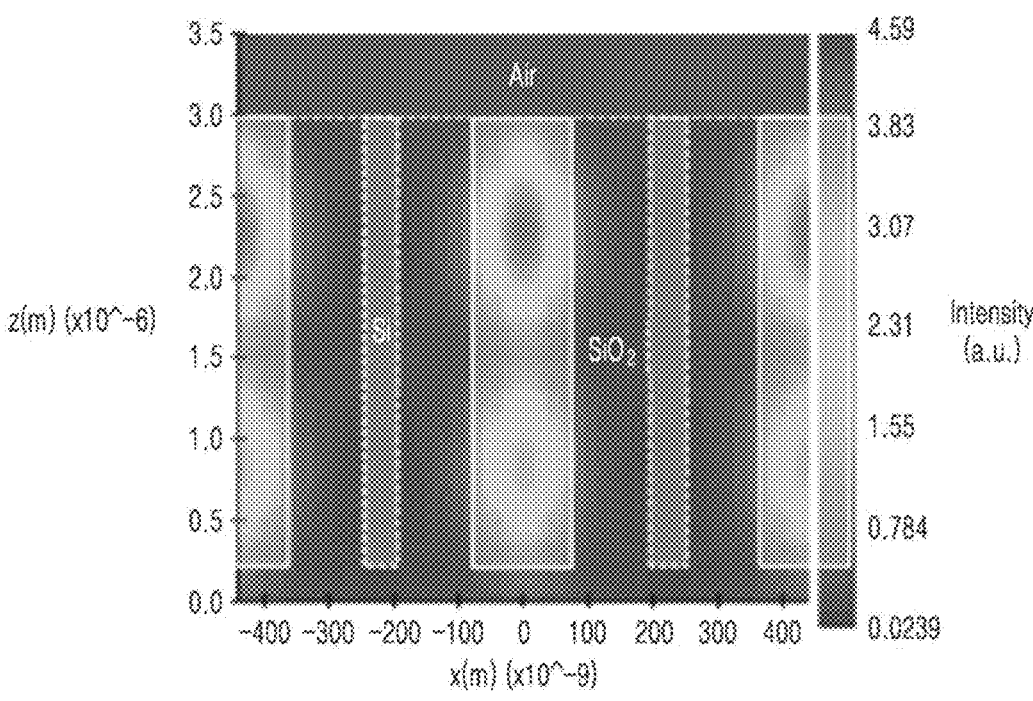
FIGS. 6A, 6B, and 6C are diagrams illustrating computational simulations in which light incident on an image
Figure 6B:
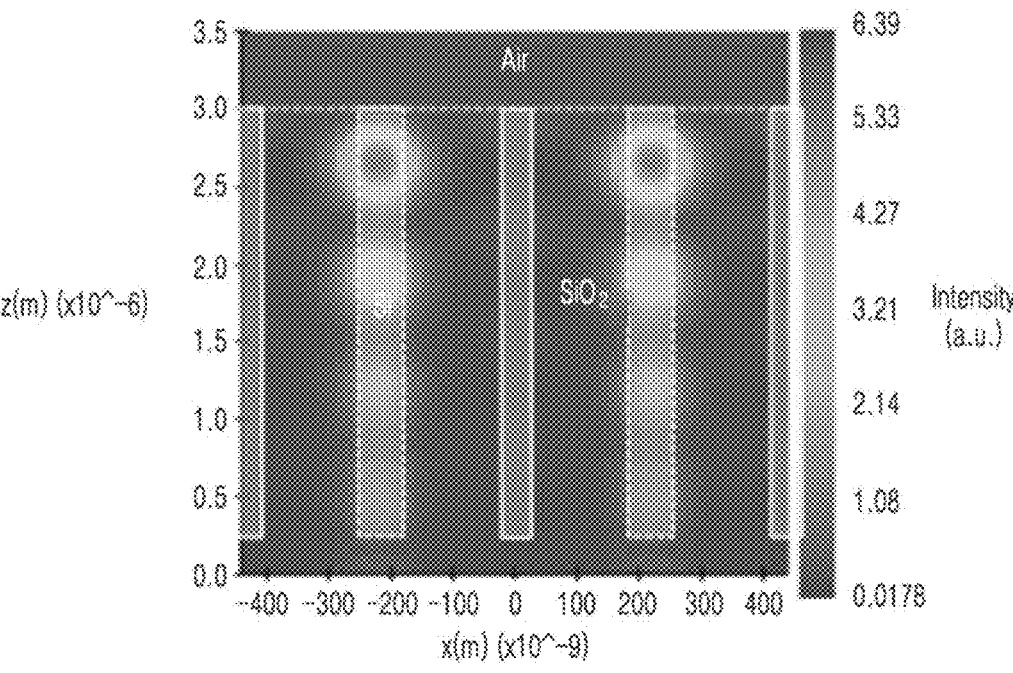
Figure 6C:
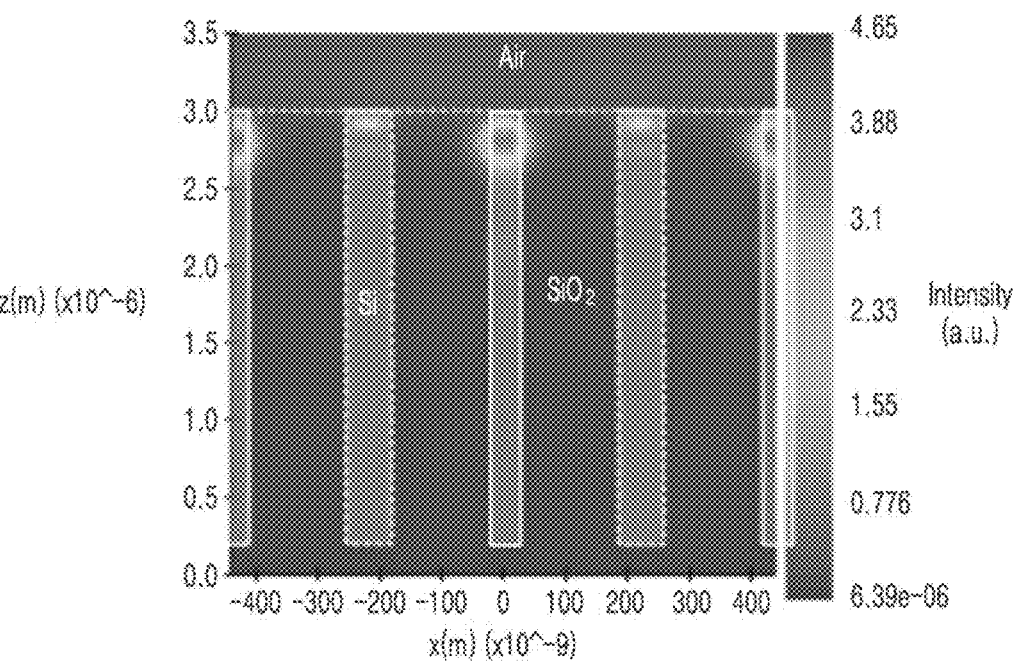

FIGS. 6A to 6C are diagrams illustrating computational simulations in which light incident on an image sensor according to an example embodiment is absorbed by different meta-photodiodes according to color.

FIG. 6A illustrates a light intensity distribution at the cross-section of FIG. 5A when red light having a wavelength of 610 nm is incident, and FIGS. 6B and 6C illustrate the light intensity distribution at the cross-section of FIG. 5B when green light having a wavelength of 540 nm and blue light having a wavelength of 430 nm are incident, respectively, on the cross-section of FIG. 5B.

FIG. 6A illustrates that light concentrates at a position of the red meta-photodiode, and FIGS. 6B and 6C illustrate that light concentrates at positions of the green meta-photodiode and the blue meta-photodiode, respectively.

FIG. 7 is a graph illustrating the efficiency for each color of an image sensor according to an example embodiment.

The graph show that a width of the pixel PX is about 0.45 μm, and a distance between the centers of the red meta-photodiode 100 and the blue meta-photodiode 300 is 0.22 μm. In the graph, the sensing efficiency or bandwidth for light of R, G, and B wavelengths is well represented as similar in general.

FIG. 8 is an example pixel arrangement of an image sensor according to a related example, and FIG. 9 is a graph illustrating the efficiency for each color of the image sensor according to the related example.

The image sensor according to the related example has a pixel arrangement based on a Bayer Pattern. Repeating units RU include two green sub-pixels, one red sub-pixel, and one blue sub-pixel, respectively. A width p0 of the repeating units RU is 0.6 µm, and this is a case in which a color separation structure for separating light of a corresponding color to be incident on each sub-pixel is provided.

Referring to FIG. 9, compared to the sensing efficiency of the red light, the sensing efficiency of the green light and the blue light is low, and a bandwidth is also greater than that of the red light.

Compared with FIG. 7, the repeating units RU according to the related example corresponding to a full-color pixel PX according to the example embodiment have a greater pitch than the full-color pixel PX according to the example embodiment, but the efficiency of separating and sensing color is evaluated to be lower. Furthermore, in the pixel arrangement of the related example, because the repeating unit RU is divided into four sub-regions to take charge of the color of the incident light, resolution degradation may occur also in signal processing. For example, R and B signals are obtained at two sub-pixel intervals, G signals are obtained at $\sqrt{2}*$ sub-pixel intervals, and R/G/B signal information in the sub-pixel at a position where the signal is not obtained is obtained by inference with surrounding information. Therefore, resolution degradation may be caused by under-sampling, and image artifacts, such as aliasing, may occur in an image restoration process.

On the other hand, in the image sensor 1001 according to the example embodiment, because each of the full color pixels PX of a very small pitch may separate and detect a color component, signal processing, such as sampling, is not required, the possibility of generating additional image artifacts is low, and thus, a relatively high-resolution image may be obtained.

In addition, the image sensor 1001 of the example embodiment may obtain an autofocusing signal by utilizing a plurality of autofocusing pixels PXA provided in the pixel array 1101 and the super lens 801 included in the lens array 1201.

FIG. 10 illustrates a sensitivity characteristic curve extracted from the AF pixel group AG of the image sensor 1001 of FIG. 3.

The graph shows the signal intensity with respect to angle of incidence of green light. In the AF pixel group AG, the signal sum of the left two autofocusing pixels PXA is indicated by a solid line, and the signal sum of the right two autofocusing pixels PXA is indicated by a dotted line. The two types of signal values are different depending on the angle of incidence, and a difference between the signal values may be used as an autofocus signal. The difference between the two signal values may be used to determine whether focusing or not, and may be utilized for AF driving. A module lens forming an optical image on the image sensor 1001 may be driven so that the image sensor 1001 is located at a focal length of the module lens with reference to the difference between the two signal values. The graph shows an example of a signal difference with respect to green light, and sensitivity characteristic curves with respect to red light and blue light may also be considered for generating an AF driving signal.

In the image sensor 1001 of the example embodiment, the red, green, and blue meta-photodiodes 100, 200, and 300 in the autofocusing pixel PXA are not symmetrically arranged, and therefore, the angle of incidence at which the two signal values are identical to each other represents a value greater than 0 degree. In addition, the red meta-photodiodes 100, the green meta-photodiodes 200, and the blue meta-photodiodes 300 in the left autofocusing pixel PXA and the right autofocusing pixel PXA are not symmetrical with respect to the center of the AF pixel group AG, and thus, the angle at which the two types of signal values are identical to each other may be different for each color. In this case, generating the AF driving signal may be complicated. In another example embodiment, the red, green, and blue meta-photodiodes 100, 200, and 300 in the autofocusing pixel PXA may be changed to be symmetrically arranged.

FIG. 11 is a detailed exploded perspective view illustrating a structure of an image sensor according to an example embodiment. FIG. 12 illustrates a sensitivity characteristic curve extracted from the AF pixel group AG of the image sensor of FIG. 11.

The image sensor 1002 of the example embodiment is substantially the same as the image sensor 1001 of FIG. 3, except for the arrangement of meta-photodiodes in the pixels PX, that is, the imaging pixel PXI and the autofocusing pixel PXA.

Each of the imaging pixel PXI and autofocusing pixel PXA includes a red meta-photodiode 102 disposed at the center, two green meta-photodiodes 202 spaced apart in one diagonal direction, and two blue meta-photodiodes 302 spaced apart in the other diagonal direction. The red, green, and blue meta-photodiodes 102, 202, and 302 are arranged to have a rotational symmetry of 180 degrees with the red meta-photodiode 102 at the center therebetween. In addition, the meta-photodiodes of the left two autofocusing pixels PXA and the meta-photodiodes of the right two autofocusing pixels PXA in the AF pixel group AG are symmetrically arranged with respect to the center of the AF pixel group AG. In this case, as shown in the sensitivity characteristic curve of FIG. 12, the signal sum of the left two autofocusing pixels PXA and the signal sum of the right two autofocusing pixels PXA are the same value at a position of 0 degree. The graph of FIG. 12 relates to the green light, and similarly in the sensitivity characteristic curves with respect to not only green light but also red light and blue light, the sum of the two types of signals may represent the same value at the position of 0 degree.

FIGS. 13 to 17 are perspective views illustrating image sensors according to various example embodiments.

Figure 13:
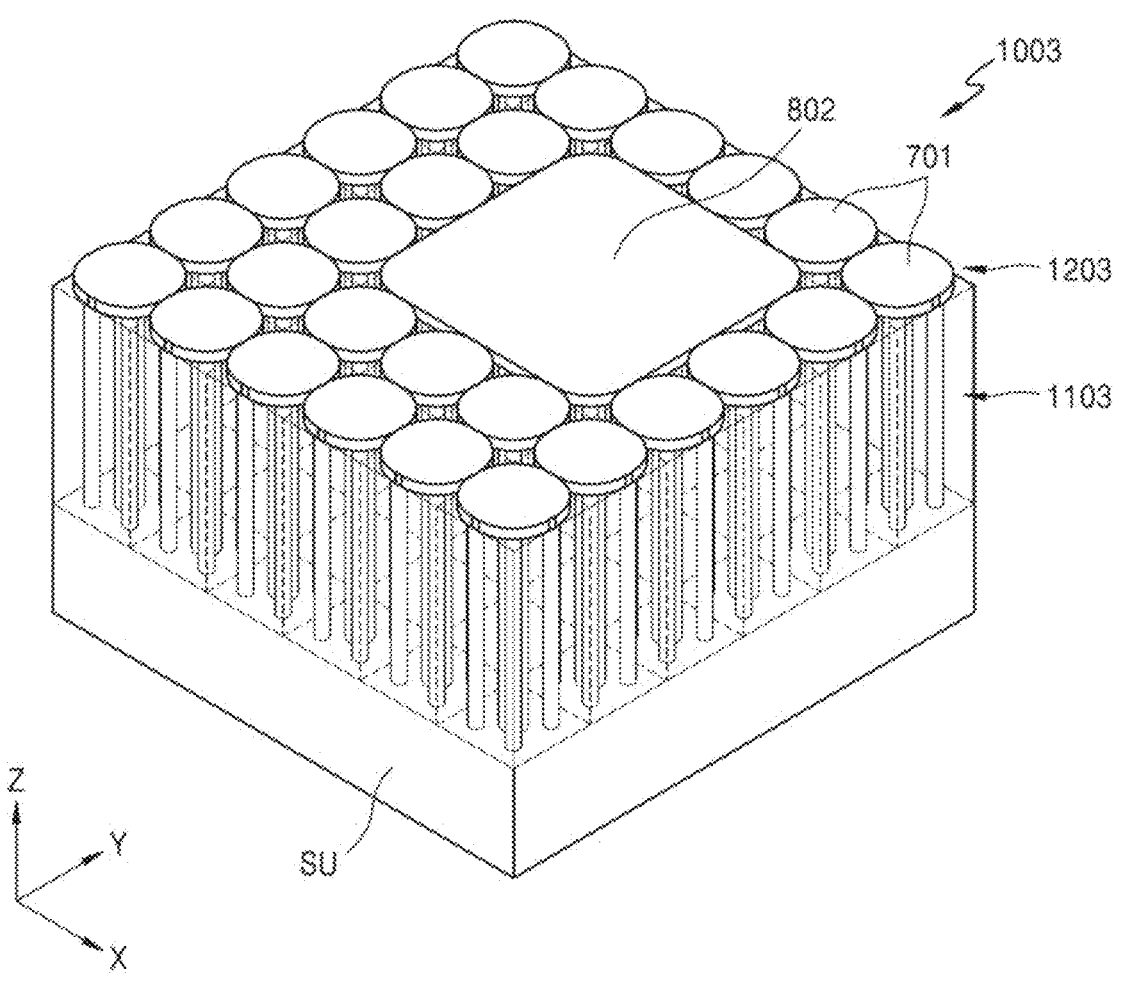

An image sensor 1003 of FIG. 13 is substantially the same as the image sensor 1002 of FIG. 11, except that a pixel array 1103 has a 3×3 arrangement of autofocusing pixels and forming an AF pixel group, and a lens array 1203 includes a super lens 802 facing the AF pixel group.

Figure 14A:
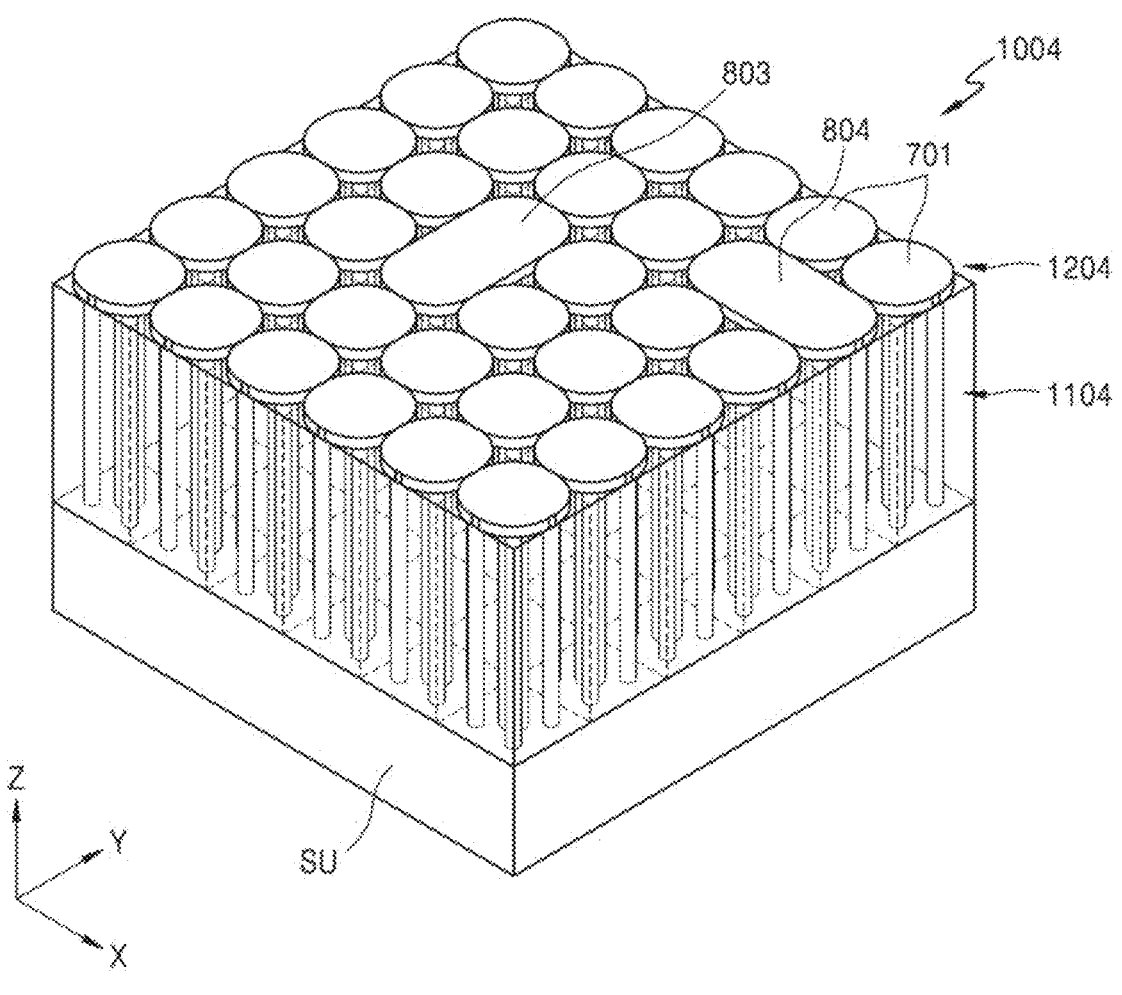

An image sensor 1004 of FIG. 14A is substantially the same as the image sensor 1002 of FIG. 11, except that a pixel array 1104 includes autofocusing pixels in a 1×2 arrangement and autofocusing pixels in a 2×1 arrangement and forming two AF pixel groups, and a lens array 1204 includes two super lenses 803 and 804 respectively facing the two AF pixel groups.

Figure 14B:
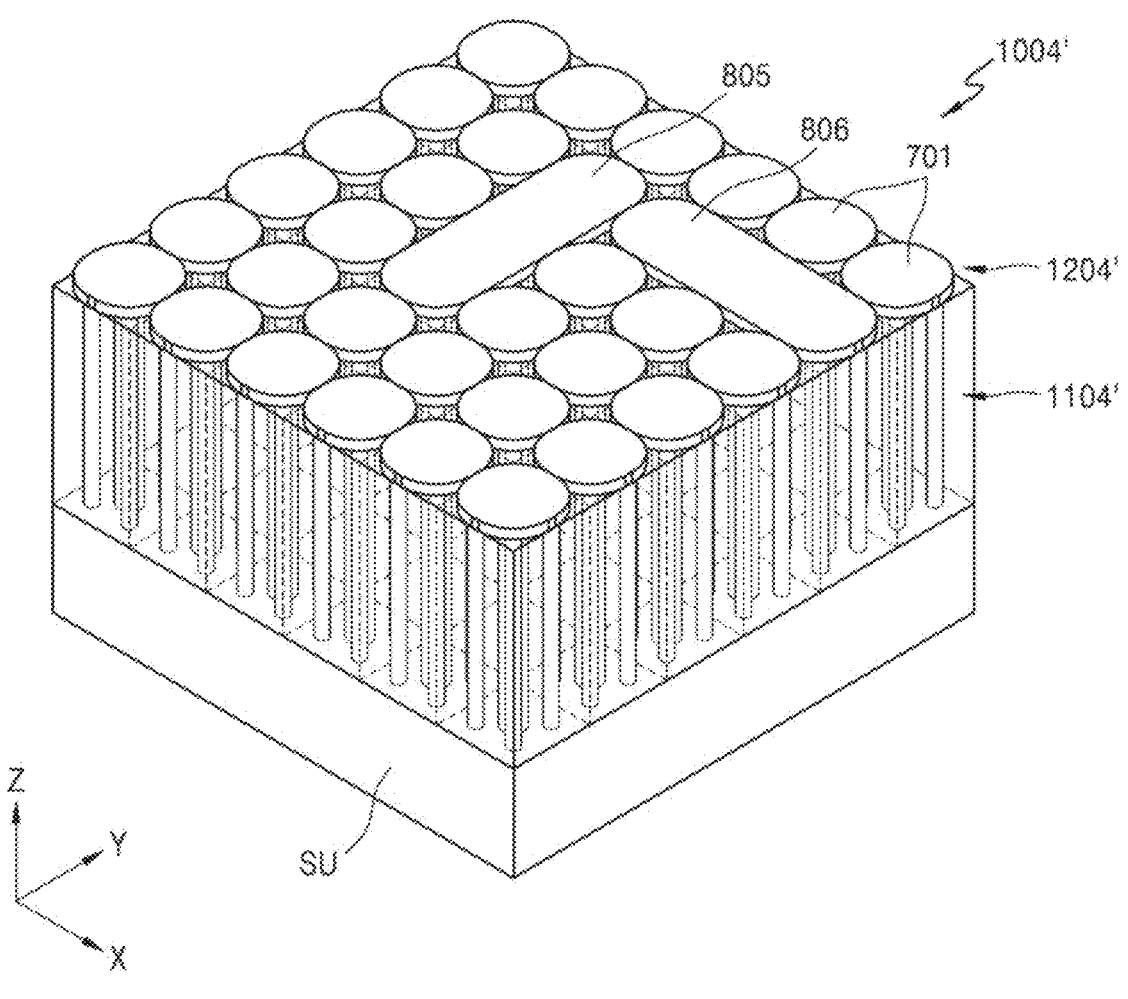

An image sensor 1004' of FIG. 14B is substantially the same as the image sensor 1002 of FIG. 11, except that a pixel array 1104' includes autofocusing pixels in a 1×3 arrangement and autofocusing pixels in a 3×1 arrangement and forming two AF pixel groups, and a lens array 1204' includes two super lenses 805 and 806 respectively facing the two AF pixel groups.

Figure 15:
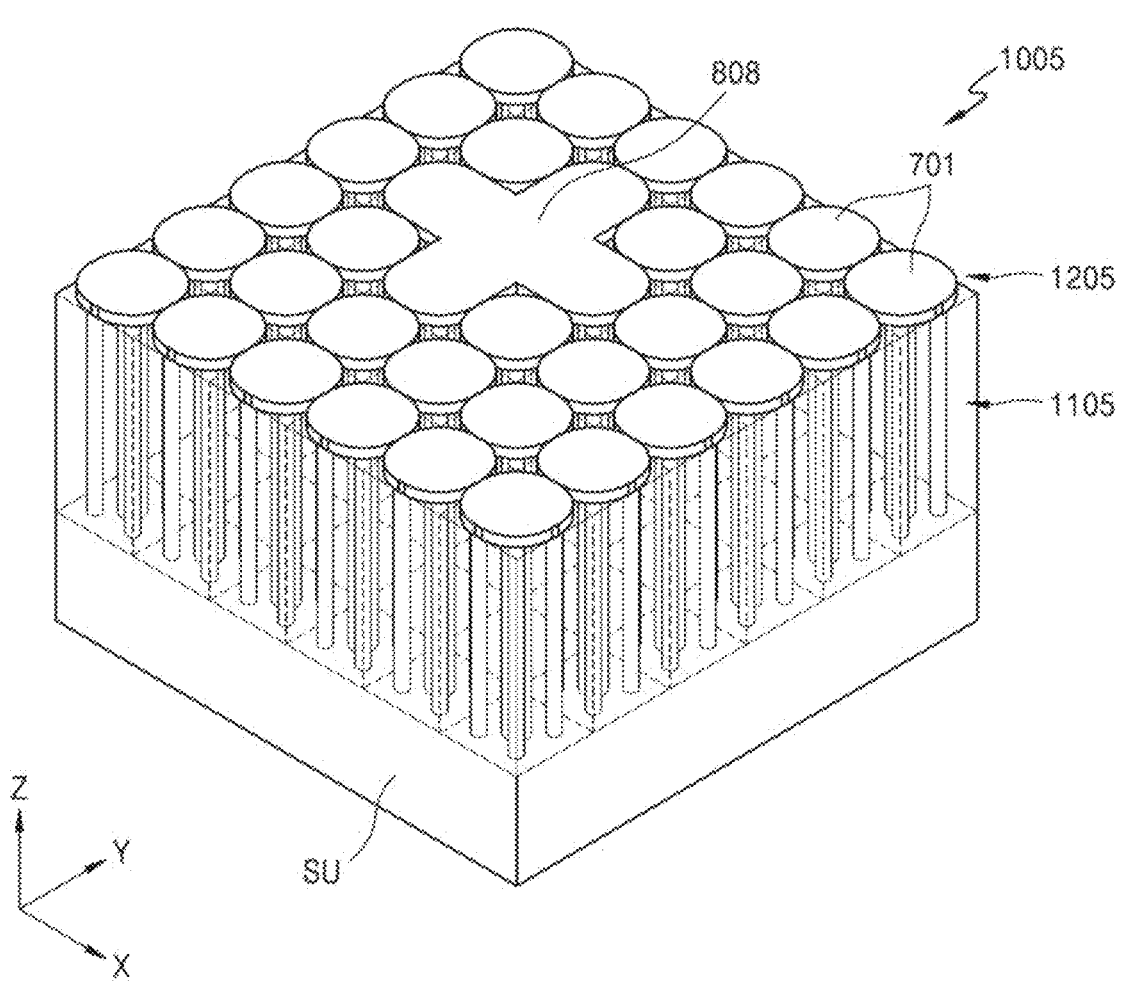

An image sensor 1005 of FIG. 15 is substantially the same as the image sensor 1002 of FIG. 11, except that a pixel array 1105 includes autofocusing pixels arranged in a cross shape and forming an AF pixel group, and a lens array 1205 includes a cross shape super lens 808 covering and facing the AF pixel group.

An image sensor 1006 of FIG. 16 is substantially the same as the image sensor 1002 of FIG. 11, except that pixels PXA and the imaging pixels PXI of a pixel array 1106 includes meta-photodiodes arranged in different shapes, respectively.

The imaging pixel PXI includes the red meta-photodiode 100, the green meta-photodiode 200, and the blue meta-photodiode 300 which are not symmetrically arranged. The imaging pixel PXA includes the red meta-photodiode 102, the green meta-photodiode 202, and the blue meta-photodiode 302 which are symmetrically arranged.

An image sensor 1007 of FIG. 17 is substantially the same as the image sensor 1002 of FIG. 11, except that a lens array 1207 is configured as a meta lens.

The lens array 1207 includes a micro lens 707 facing the imaging pixel PXI and a super lens 807 facing the AF pixel group AG. Each of the micro lens 707 and the super lens 807 includes a plurality of nanostructures NP. As shown, the nanostructure NP may be a nano-pillar having a cross-sectional width or diameter of a sub-wavelength dimension. The sub-wavelength means a wavelength smaller than a wavelength band of the light condensed by the lens array 1207. When an incident light is a visible light, the cross-sectional diameter of the nanostructure NP may have a dimension, for example, smaller than about 400 nm, about 300 nm, or about 200 nm. The height of the nanostructure NP may be about 500 nm to about 1500 nm, and may be greater than the cross-sectional diameter of the nanostructure NP.

The nanostructure NP may include a material having a relatively high refractive index and a relatively low absorption rate in a visible light band compared to surrounding materials. For example, the nanostructure NP may include c-Si, p-Si, a-Si and III-V compound semiconductors (gallium phosphide (GaP), gallium nitride (GaN), gallium arsenide (GaAs), etc.), silicon carbide (SiC), titanium oxide ($TiO_2$), silicon nitride ($SiN_3$), zinc sulfide (ZnS), zinc selenide (ZnSe), silicon nitride ($Si_3N_4$) and/or a combination thereof. The periphery of the nanostructure NP may be filled with a dielectric material DL having a relatively lower refractive index than the nanostructure NP and a relatively low absorption rate in the visible light band. For example, the periphery of the nanostructure NP may be filled with siloxane-based spin on glass (SOG), silicon oxide ($SiO_2$), silicon nitride ($Si_3N_4$), aluminum oxide ($Al_2O_3$), air, etc.

The refractive index of the nanostructure NP may be equal to or greater than about 2.0 with respect to light having a wavelength of about 630 nm, and the refractive index of the dielectric material DL may be equal to or greater than about 1.0 and equal to or smaller than about 2.0 with respect to the light having the wavelength of about 630 nm. Also, a difference between the refractive index of the nanostructure NP and the refractive index of the dielectric material DL may be equal to or greater than about 0.5. The nanostructure NP having the difference in the refractive index with the surrounding material may change the phase of light passing through the nanostructure NP. This is due to a phase delay caused by the shape dimension of the sub-wavelength of the nanostructure NP, and a degree of the phase delay is determined by the detailed shape dimension and arrangement form of the nanostructure NP.

The plurality of micro lenses 707 may include the nanostructures NP having shapes and arrangements determined to collect light to the imaging pixels PXI respectively facing the plurality of micro lenses 707. The super lens 807 may include the nanostructures NP having shapes and arrangements determined to collect light to the AF pixel group AG facing the super lens 807. As shown, in the micro lens 707 and the super lens 807, the width or diameter of the nanostructure NP disposed at the center is the largest, and the widths or diameters of the nanostructures NP farther from the center may be reduced. However, embodiments are not limited thereto.

The forms of the meta-photodiodes of the imaging pixel PXI in the above descriptions may be modified into more diverse types, numbers, and arrangements.

FIG. 18A illustrates another example of a pixel structure that may be applied to an image sensor according to an example embodiment, and FIG. 18B is a graph illustrating the efficiency for each color of the image sensor of FIG. 18A.

Referring to FIG. 18A, the pixel PX included in a pixel array 1108 of an image sensor 1008 may include one red meta-photodiode 105 selectively absorbing red light, a plurality of green meta-photodiodes 205 selectively absorbing green light, and a plurality of blue meta-photodiodes 305 selectively absorbing blue light. The red meta-photodiode 105 may be disposed at the center of the pixel PX, and four green meta-photodiodes 205 and four blue meta-photodiodes 305 may be disposed adjacent to and to surround the red meta-photodiode 105 in a square shape. However, embodiments are not limited thereto, and positions of the green meta-photodiode 205 and the blue meta-photodiode 305 may be switched from each other. The meta-photodiodes in the pixel PX may be symmetrically arranged with respect to the center of the pixel PX, and the shape of the pixel PX may be applied to both an imaging pixel and an autofocusing pixel.

In the graph of FIG. 18B, the width of the pixel PX is about 0.45 µm, and the distance between centers of the red meta-photodiode 105 and the blue meta-photodiode 305 is about 0.15 µm. In the graph, sensing efficiencies or band widths of light of R, G, and B wavelengths are generally similar. Compared to the graph of FIG. 7 with respect to the arrangement of different types of meta-photodiodes, the sensing efficiencies of blue light and green light are more similar to each other, and the sensing efficiency of red light is higher. It may be seen from the graph that the sensing efficiency for each color may be adjusted by adjusting the shape, size, and arrangement of the meta-photodiodes.

FIGS. 19 to 22 are plan views illustrating pixel arrays of image sensors according to some example embodiments.

Figure 19:
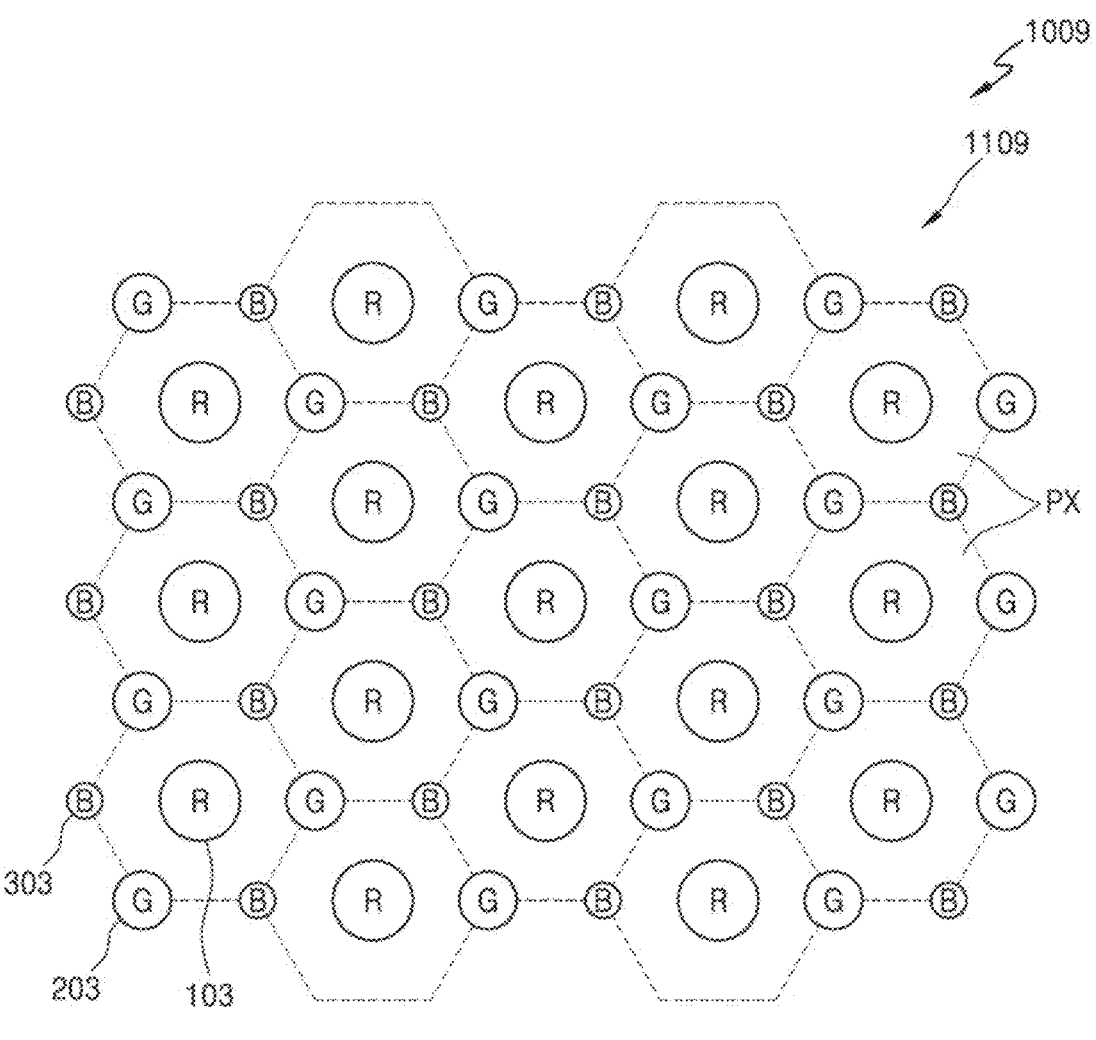

Referring to FIG. 19, in a pixel array 1109 of an image sensor 1009, the pixels PX may be arranged in a hexagonal grid shape. One full-color pixel PX may include one red meta-photodiode 103 selectively absorbing red light, three green meta-photodiodes 203 selectively absorbing green light, and three blue meta-photodiodes 303 selectively absorbing blue light. The red meta-photodiode 103 may be disposed at the center of the hexagon, and the green meta-photodiodes 203 and the blue meta-photodiodes 303 may be alternately disposed at each vertex of the hexagon. The shape of the pixel PX may be applied to both an imaging pixel and an autofocusing pixel.

Figure 20:
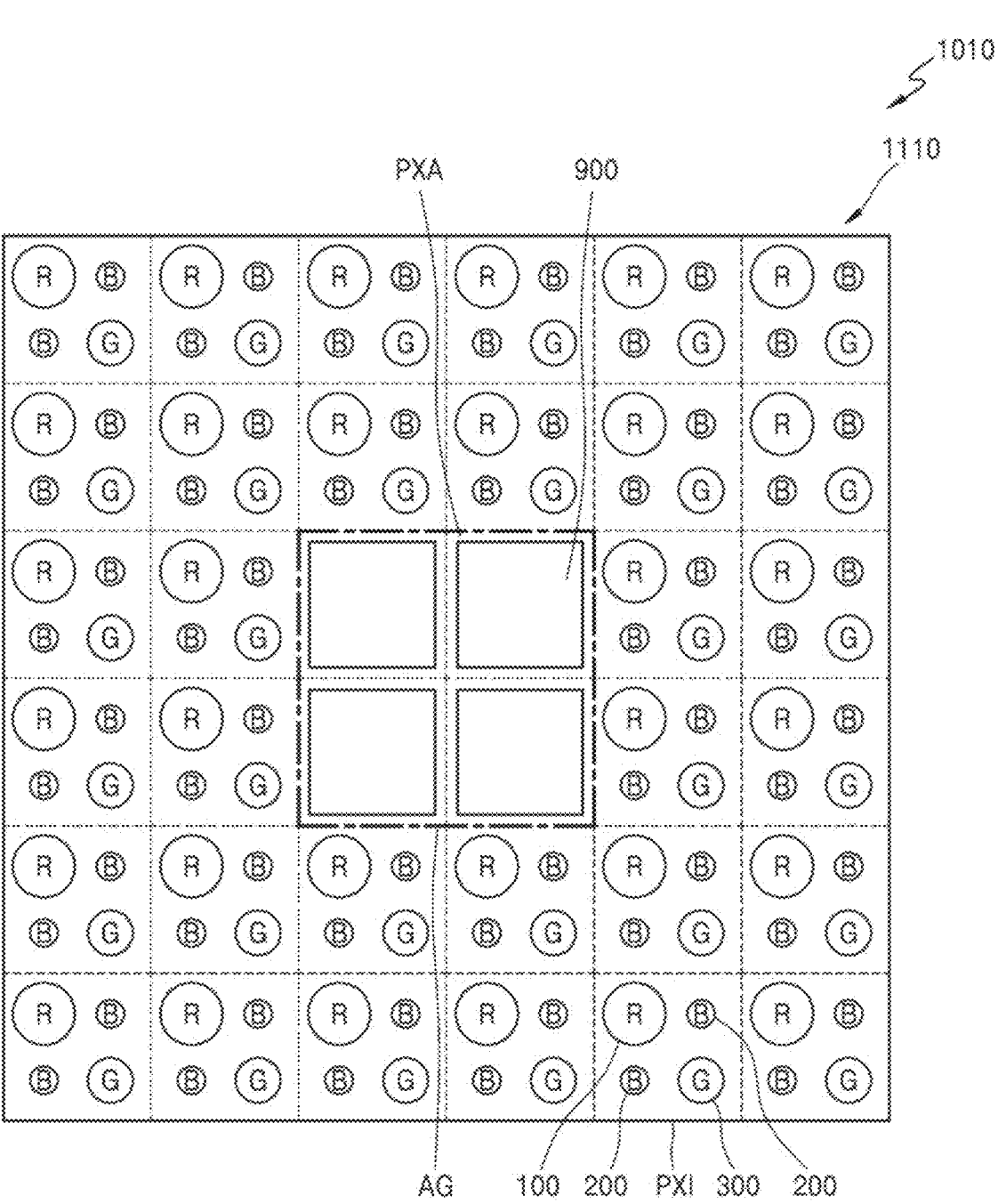

Referring to FIG. 20, in a pixel array 1110 of an image sensor 1010, the autofocusing pixel PXA may include a photodetector 900 having no wavelength selectivity. Similar to the meta-photodiodes described above, the photodetector 900 may have a p-i-n structure sensing light, but is different from the image sensor 1001 of FIG. 3 in that the photodetector 900 does not selectively absorb light of a specific wavelength.

When the imaging pixel PXI includes the red meta-photodiode 100, the green meta-photodiode 200, and the blue meta-photodiode 300 which are not symmetrically arranged, the autofocusing pixel PXA may include the photodetector 900 having no wavelength selectivity in order to obtain a sensitivity characteristic signal having symmetry. A plurality of photodetectors 900 may be formed by forming a p-i-n structure with a width corresponding to an AF pixel group AF, and then separating sensing regions with deep trench insulation (DTI).

Figure 21:
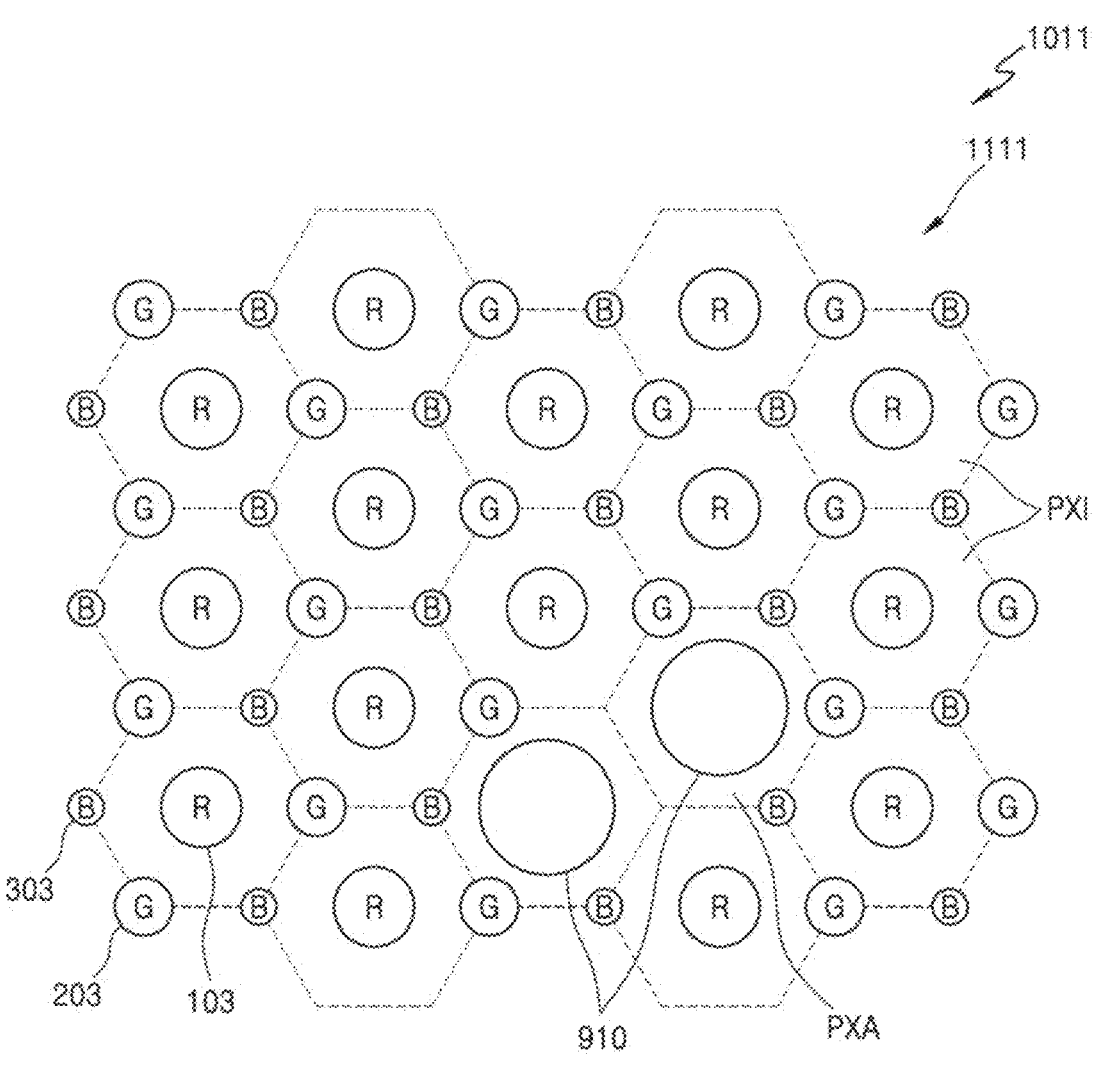

Referring to FIG. 21, an image sensor 1011 is different from the image sensor 1009 of FIG. 19 in that the autofocusing pixels PXA of a pixel array 1111 include a photodetector 910 having no wavelength selectivity.

Figure 22:
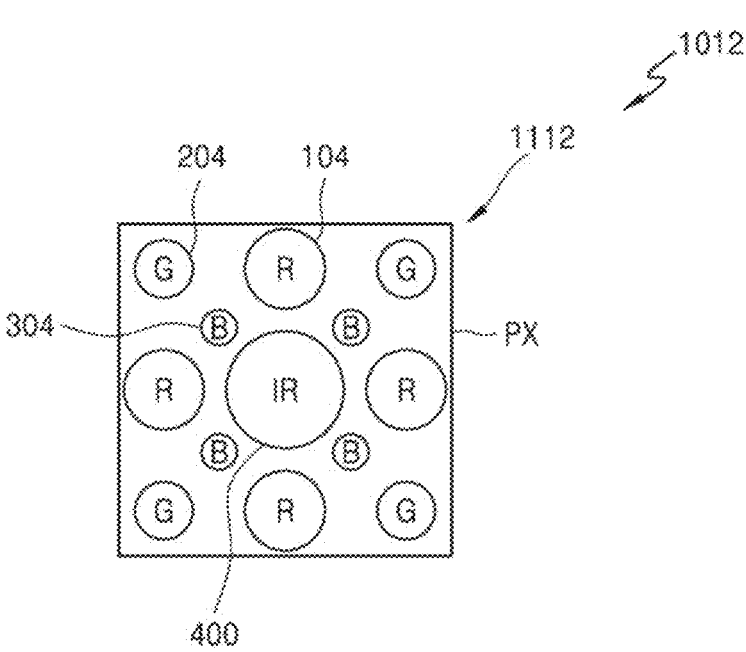

Referring to FIG. 22, the pixel PX of the pixel array 1112 of the image sensor 1012 may include a red meta-photodiode 104 selectively absorbing red light, a green meta-photodiode 204 selectively absorbing green light, and a blue meta-photodiode 304 selectively absorbing blue light, and may further include an infrared meta-photodiode 400 selectively absorbing light of an infrared wavelength band. The structure of the pixel PX may be applied to both an imaging pixel and an autofocusing pixel.

One infrared meta-photodiode 400 may be disposed at the center of the pixel PX, and four red meta-photodiodes 104, four green meta-photodiodes 204, and four blue meta-photodiodes 304 may be disposed adjacent to and to surround the infrared meta-photodiode 400. The diameter of the infrared meta-photodiode 400 may be the largest, for example, greater than 100 nm. The diameter of the blue meta-photodiode 304 may be set in the range of about 100 nm to about 200 nm.

As described above, in addition to color information on an object, depth information may be further obtained from the image sensor that further includes a meta-photodiode that selectively absorbs an infrared wavelength band in addition to the meta-photodiode that selectively absorbs R, G, and B colors. For example, a camera module including such image sensor may further include an infrared light source configured to emit infrared light to an object, and infrared information sensed by the image sensor may be utilized to obtain depth information of the object. For example, depth information of an object may be obtained based on infrared information sensed by the image sensor, and color information of the object may be obtained based on sensed visible light information. In addition, 3D image information may be obtained by combining color information with depth information.

In the above description, the number of AF pixel groups AG and the number and arrangement of the autofocusing pixels PXA in the AF pixel group AG have specific forms, but embodiments are not limited thereto. For example, the AF pixel group AG may be formed by the arrangement and number of the autofocusing pixels PXA such as 1×N, N×1, and M×M. Here, N and M are integers greater than or equal to 2, and the smaller the width of the pixel PX, the greater the number of autofocusing pixels PXA constituting the AF pixel group AG.

Although it has been described that the pixels PX provided in the image sensors 1000 to 1012 sense R, G, and B colors, the pixels PX may be modified to include a meta-photodiode distinguishing and detecting light of different wavelength bands. For example, in order to obtain a hyperspectral image in an ultraviolet to infrared wavelength range, a plurality of meta-photodiodes having different cross-sectional diameters, for example 4, 8, or 16 meta-photodiodes, may be provided in one pixel. A width of a pixel, in which the meta-photodiodes are provided, may be set to be equal to or less than $\lambda_m$, which is the shortest wavelength among the wavelength bands. This is a value corresponding to a diffraction limit when an F-number of the imaging optical system is assumed to be about 1.0. A minimum width of a pixel may be set to be suitable for diameters and the number of meta-photodiodes included in one pixel.

In addition, the pixels PX provided in the image sensor 1000 to 102 may be changed to include meta-photodiodes sensing cyan/magenta/yellow colors, or may be configured to sense other multi-colors.

The image sensor according to the example embodiment may constitute a camera module together with module lenses having various performances, and may be utilized in various electronic apparatuses.

FIG. 23 is a schematic block diagram of an electronic apparatus including an image sensor according to example embodiments. Referring to FIG. 23, in a network environment ED00, an electronic apparatus ED01 may communicate with another electronic apparatus ED02 through a first network ED98 (a short-range wireless communication network, etc.) or may communicate with another electronic apparatus ED04 and/or a server ED08 through a second network ED99 (a remote wireless communication network, etc.) The electronic apparatus ED01 may communicate with the electronic apparatus ED04 through the server ED08. The electronic apparatus ED01 may include a processor ED20, a memory ED30, an input device ED50, an audio output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some of these components (e.g., the display device ED60) may be omitted or other components may be added. Some of these components may be implemented as one integrated circuit. For example, the sensor module ED76 (a fingerprint sensor, an iris sensor, an illuminance sensor, etc.) may be implemented by being embedded in the display device ED60 (a display, etc.)

The processor ED20 may control one or a plurality of other components (hardware, software components, etc.) of the electronic apparatus ED01 connected to the processor ED20 by executing software (e.g., a program ED40), and may perform various data processing or operations. As a part of data processing or computations, the processor ED20 may load commands and/or data received from other components (the sensor module ED76 and the communication module ED90, etc.) into a volatile memory ED32 and may process commands and/or data stored in the volatile memory ED32, and the resulting data may be stored in a non-volatile memory ED34. The processor ED20 may include a main processor ED21 (a central processing unit, an application processor, etc.) and an auxiliary processor ED23 (a graphics processing unit, an image signal processor, a sensor hub processor, a communication processor, etc.) that may be operated independently or together with the main processor ED21. The auxiliary processor ED23 may use less power than the main processor ED21 and may perform a specialized function.

The auxiliary processor ED23 is configured to replace the main processor ED21 while the main processor ED21 is in the inactive state (sleep state) or the main processor ED21 while the main processor ED21 is in the active state (the application execution state). Together with the processor ED21, functions and/or states related to some of the components of the electronic apparatus ED01 (the display device ED60, the sensor module ED76, the communication module ED90, etc.) may be controlled. can The auxiliary processor ED23 (an image signal processor, a communication processor, etc.) may be implemented as a part of other functionally related components (the camera module ED80, the communication module ED90, etc.)

The memory ED30 may store various pieces of data required by components of the electronic apparatus ED01 (such as the processor ED20 and the sensor module ED76). The data may include, for example, input data and/or output data for software (such as the program ED40) and instructions related thereto. The memory ED30 may include the volatile memory ED32 and/or the nonvolatile memory ED34.

The program ED40 may be stored as software in the memory ED30 and may include an operating system ED42, middleware ED44, and/or an application ED46.

The input device ED50 may receive a command and/or data to be used in a component (such as, the processor ED20) of the electronic apparatus ED01 from the outside of the electronic apparatus ED01 (e.g., a user). The input device ED50 may include a microphone, a mouse, a keyboard, and/or a digital pen (such as, a stylus pen).

The audio output device ED55 may output a sound signal to the outside of the electronic apparatus ED01. The audio output device ED55 may include a speaker and/or a receiver. The speaker may be used for general purposes, such as, multimedia playback or recording playback, and the receiver may be used to receive an incoming call. The receiver may be incorporated as a part of the speaker or may be implemented as an independent separate device.

The display device ED60 may visually provide information to the outside of the electronic apparatus ED01. The display device ED60 may include a control circuit for controlling a display, a hologram device, or a projector, and a corresponding device. The display device ED60 may include touch circuitry configured to sense a touch, and/or sensor circuitry configured to measure the intensity of force generated by the touch (a pressure sensor, etc.)

The audio module ED70 may convert sound into an electric signal or, conversely, convert an electric signal into sound. The audio module ED70 may obtain sound through the input device ED50 or output sound through a speaker and/or headphones of the audio output device ED55 and/or another electronic apparatus (the electronic apparatus ED02, etc.) directly or wirelessly connected to the electronic apparatus ED01

The sensor module ED76 may detect an operating state (power, temperature, etc.) of the electronic apparatus ED01 or an external environmental state (a user state, etc.), and generate an electrical signal and/or data value corresponding to the sensed state. The sensor module ED76 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface ED77 may support one or more designated protocols that may be used by the electronic apparatus ED01 to directly or wirelessly connect with another electronic apparatus (the electronic apparatus ED02, etc.) The interface ED77 may include a high definition multimedia interface (HDMI), a universal serial bus (USB) interface, an SD card interface, and/or an audio interface.

A connection terminal ED78 may include a connector through which the electronic apparatus ED01 may be physically connected to another electronic apparatus (the electronic apparatus ED02, etc.) The connection terminal ED78 may include an HDMI connector, a USB connector, an SD card connector, and/or an audio connector (a headphones connector, etc.)

The haptic module ED79 may convert an electrical signal into a mechanical stimulus (vibration, movement, etc.) or an electrical stimulus that may be perceived by the user through tactile or kinesthetic sense. The haptic module ED79 may include a motor, a piezoelectric element, and/or an electrical stimulation device.

The camera module ED80 may capture still images and moving images. The camera module ED80 may include a lens assembly including one or more lenses, the image sensors 1000 to 1012 described above, image signal processors, and/or flashes. The lens assembly included in the camera module ED80 may collect light emitted from an object, an image of which is to be captured.

The power management module ED88 may manage power supplied to the electronic apparatus ED01. The power management module ED88 may be implemented as part of a power management integrated circuit (PMIC).

The battery ED89 may supply power to components of the electronic apparatus ED01. The battery ED89 may include a non-rechargeable primary cell, a rechargeable secondary cell, and/or a fuel cell.

The communication module ED90 may support the establishment of a direct (wired) communication channel and/or a wireless communication channel between the electronic apparatus ED01 and other electronic apparatuses (the electronic apparatus ED02, the electronic apparatus ED04, the server ED08, etc.) and perform communications through the established communication channel. The communication module ED90 may include one or a plurality of communication processors that operate independently from the processor ED20 (an application processor, etc.) and support direct communication and/or wireless communication. The communication module ED90 may include a wireless communication module ED92 (a cellular communication module, a short-range wireless communication module, and a Global Navigation Satellite System (GNSS) communication module, etc.) and/or a wired communication module ED94 (a local area network (LAN) communication module, a power line communication module, etc.) Among these communication modules, a corresponding communication module may communicate with other electronic apparatuses through the first network ED98 (a short-range communication network, such as Bluetooth, WiFi Direct, or Infrared Data Association (IrDA)) or the second network ED99 (a telecommunication network, such as a cellular network, the Internet, or a computer network, such as a LAN, a wide area network (WAN), etc.) The various types of communication modules may be integrated into one component (a single chip, etc.) or implemented as a plurality of components (plural chips) separate from each other. The wireless communication module ED92 may identify and authenticate the electronic apparatus ED01 within a communication network, such as the first network ED98 and/or the second network ED99, by using subscriber information (such as, an International Mobile Subscriber Identifier (IMSI)) stored in a subscriber identification module ED96.

The antenna module ED97 may transmit or receive signals and/or power to and from the outside (other electronic apparatuses, etc.) An antenna may include a radiator having a conductive pattern formed on a substrate (a printed circuit board (PCB), etc.) The antenna module ED97 may include one or a plurality of antennas. When a plurality of antennas are included in the antenna module ED97, an antenna suitable for a communication method used in a communication network, such as the first network ED98 and/or the second network ED99, from among the plurality of antennas may be selected by the communication module ED90. Signals and/or power may be transmitted or received between the communication module ED90 and another electronic apparatus through the selected antenna. In addition to the antenna, other components (a radio-frequency integrated circuit (RFIC), etc.) may be included as part of the antenna module ED97.

Some of the components, between peripheral devices, may be connected to each other through communication methods (a bus, General Purpose Input and Output (GPIO), Serial Peripheral Interface (SPI), Mobile Industry Processor Interface (MIPI), etc.) and signals (commands, data, etc.) may be interchangeable.

Commands or data may be transmitted or received between the electronic apparatus ED01 and an external electronic apparatus (the electronic apparatus ED04) through the server ED08 connected to the second network ED99. The electronic apparatuses ED02 and ED04 may be the same type as or different types from the electronic apparatus ED01. All or part of the operations executed by the electronic apparatus ED01 may be executed by one or more of the electronic apparatuses ED02 and ED04 and the server ED08. For example, when the electronic apparatus ED01 needs to perform a function or service, the electronic apparatus ED01 may request one or more other electronic apparatuses to perform part or all of the function or service instead of executing the function or service itself. One or more other electronic apparatuses receiving the request may execute an additional function or service related to the request, and transmit a result of the execution to the electronic apparatus ED01. To this end, cloud computing, distributed computing, and/or client-server computing technologies may be used.

FIG. 24 is a schematic block diagram illustrating the camera module ED80 included in the electronic apparatus ED01 of FIG. 23. Referring to FIG. 24, the camera module ED80 may include a lens assembly 1170, a flash 1120, the image sensor 1000, an image stabilizer 1140, an AF controller 1130, a memory 1150 (a buffer memory, etc.), an actuator 1180, and/or an image signal processor (ISP) 1160.

The lens assembly 1170 may collect light emitted from an object to be imaged. The lens assembly 1170 may include one or more optical lenses. The lens assembly 1170 may include a path conversion member that bends a path of light and directs the light toward the image sensor 1000. The camera module ED80 may have a vertical shape or a folded shape according to whether to include the path conversion member and an arrangement type between the path conversion member and the one or more optical lenses. The camera module ED80 may include a plurality of lens assemblies 1170, and, in this case, the camera module ED80 may be a dual camera, a 360° camera, or a spherical camera. Some of the plurality of lens assemblies 1170 may have the same lens property (an angle of view, a focal length, an auto focus, an F-number, an optical zoom, etc.) or may have different lens properties. The lens assembly 1170 may include a wide-angle lens or a telephoto lens.

The actuator 1180 may drive the lens assembly 1170. For example, the actuator 1180 may move, for example, at least some of the one or more optical lenses and the path conversion member constituting the lens assembly 1170. The optical lenses may move along the optical axis, and an optical zoom ratio may be adjusted by moving at least some of the optical lenses included in the lens assembly 1170 and adjusting distances between the adjacent lenses.

The actuator 1180 may adjust the position of any one of the optical lenses included in the lens assembly 1170 so that the image sensor 1000 is positioned at a focal length of the lens assembly 1170. The actuator 1180 may drive the lens assembly 1170 according to an AF driving signal transmitted from the AF controller 1130.

The flash 1120 may emit light to be used to enhance light emitted or reflected from an object. The flash 1120 may emit visible light or infrared light. The flash 1120 may include one or a plurality of light-emitting diodes (a Red-Green-Blue (RGB) LED, a White LED, an Infrared LED, an Ultraviolet LED, etc.), and/or a Xenon Lamp. The image sensor 1000 may be the image sensor 1000 described with reference to FIG. 1, may be any one of the image sensors 1001 to 1012 described above, and may have a combination or modified form thereof. The image sensor 1000 may obtain an image corresponding to the object by converting light emitted or reflected from the object and transmitted through the lens assembly 1170 into an electrical signal.

The image sensor 1000 may include pixels each having a small pixel width, for example, a width equal to or smaller than the diffraction limit described above, and classifying and sensing a plurality of different types of wavelengths. The width p of each of the plurality of pixels provided in the image sensor 1000 may satisfy a condition of $$p < \lambda \cdot F.$$

Here, F is the F-number of the lens assembly 1170, and λ is the center wavelength of a blue wavelength band.

The image sensor 1000 includes an autofocusing pixel group and a super lens corresponding to the autofocusing pixel group, so that an AF driving signal may be generated from a signal from the autofocusing pixel group.

The image stabilizer 1140 may move one or a plurality of lenses or the image sensor 1000 included in the lens assembly 1170 in a specific direction in response to the movement of the camera module ED80 or the electronic apparatus ED01 including the camera module ED80, or may compensate for a negative influence due to movement by controlling (adjustment of read-out timing, etc.) operating characteristics of the image sensor 1000. The image stabilizer 1140 may detect the movement of the camera module ED80 or the electronic apparatus ED01 by using a gyro sensor or an acceleration sensor disposed inside or outside the camera module ED80. The image stabilizer 1140 may be optically implemented.

The AF controller 1130 may generate an AF driving signal from a signal value sensed from an autofocusing pixel group of the image sensor 1000, for example, a signal difference value between left and right autofocusing pixels. The AF controller 1130 may control the actuator 1180 according to the AF driving signal.

The memory 1150 may store some or all of image data acquired by the image sensor 1000 for the next image processing operation. For example, when a plurality of images are acquired at a high speed, the acquired original data (Bayer-Patterned data, high-resolution data, etc.) is stored in the memory 1150, and only a low-resolution image is displayed, and then, may be used to transmit the original data of the selected (user selection, etc.) image to the image signal processor 1160. The memory 1150 may be integrated into the memory ED30 of the electronic apparatus ED01 or may be configured as a separate memory operated independently.

The ISP 1160 may perform image processing on images acquired by the image sensor 1000 or image data stored in the memory 1150. Image processing may include depth map generation, three dimensional (3D) modeling, panorama generation, feature point extraction, image synthesis, and/or image compensation (noise reduction, resolution adjustment, brightness adjustment, blurring, sharpening, softening, etc.) The ISP 1160 may perform control (exposure time control, readout timing control, etc.) on components (the image sensor 1000, etc.) included in the camera module ED80. The image processed by the ISP 1160 may be stored back in the memory 1150 for further processing or provided to external components of the camera module ED80 (the memory ED30, the display device ED60, the electronic apparatus ED02, the electronic apparatus ED04, the server ED08, etc.) The ISP 1160 may be integrated into the processor ED20 or configured as a separate processor operated independently from the processor ED20. When the ISP 1160 is configured as a processor separate from the processor ED20, an image processed by the ISP 1160 may be displayed on the display device ED60 after additional image processing by the processor ED20.

The AF controller 1130 may be integrated into the ISP 1160. The ISP 1160 may process signals from the autofocusing pixels of the image sensor 1000 to generate an AF signal, and the AF controller 1130 may convert the AF signal into a driving signal of the actuator 1180 and transmit the driving signal to the actuator 1180.

As illustrated in FIG. 22, when the image sensor 1000 includes a meta-photodiode that selectively absorbs infrared wavelength band and meta-photodiodes that selectively absorb red light, green light, and blue light separately, the ISP 1160 may process an infrared signal and a visible light signal acquired from the image sensor 1000 together. The ISP 1160 may obtain a depth image of an object by processing an infrared signal, obtain a color image of the object from a visible light signal, and provide a three-dimensional image of the object by combining the depth image with the color image. The ISP 1160 may also compute information on temperature or moisture of an object from the infrared signal, and provide an image of temperature distribution or moisture distribution that is combined with a two-dimensional image (color image) of the object.

The electronic apparatus ED01 may further include one or more additional camera modules each having different properties or functions. Such a camera module may also include a configuration similar to that of the camera module ED80 of FIG. 24, and an image sensor provided therein may include one or a plurality of sensors selected from image sensors having different properties, such as a Charged Coupled Device (CCD) sensor and/or a Complementary Metal Oxide Semiconductor (CMOS) sensor, an RGB sensor, a black and white (BW) sensor, an IR sensor, or a UV sensor. In this case, one of the plurality of camera modules ED80 may be a wide-angle camera and the other may be a telephoto camera. Similarly, one of the plurality of camera modules ED80 may be a front camera and the other may be a rear camera.

FIGS. 25 to 34 are diagrams illustrating various examples of electronic apparatuses to which image sensors according to example embodiments are applied.

Figure 25:
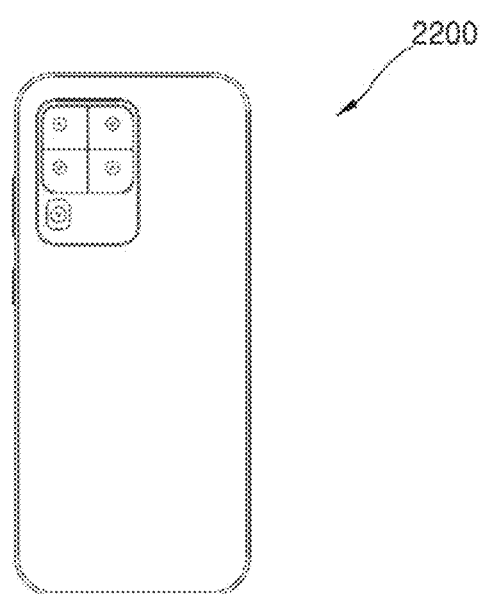
Figure 26:
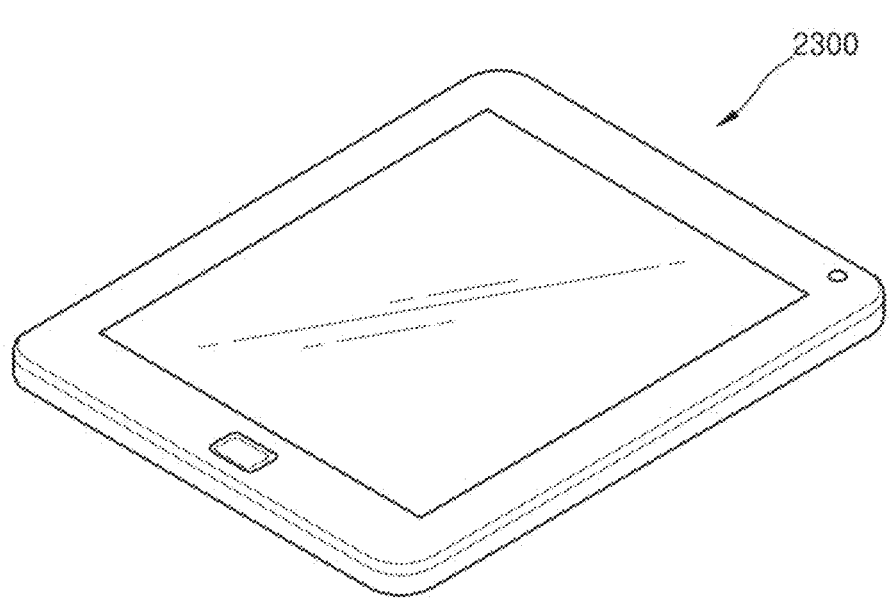
Figure 27:
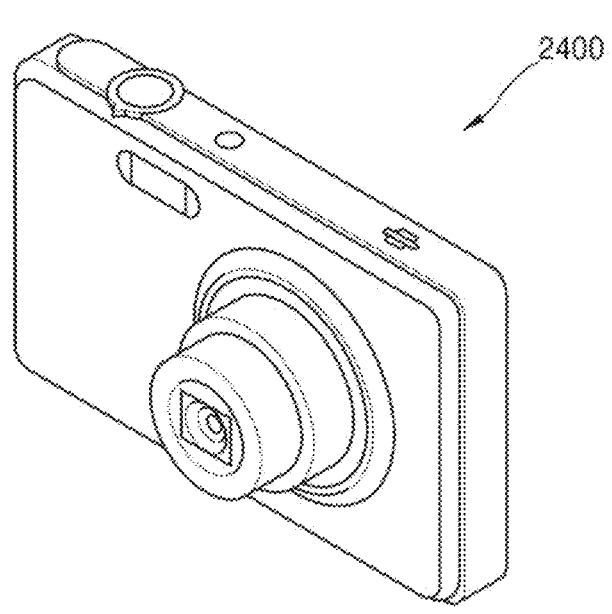
Figure 28:
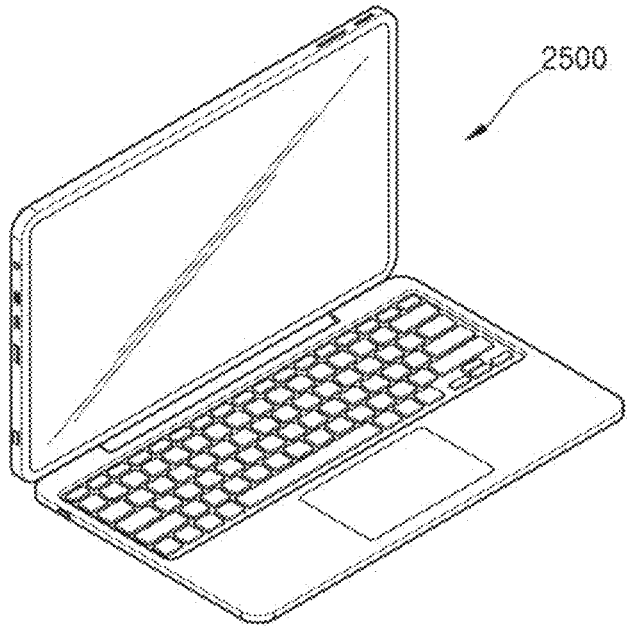
Figure 29:
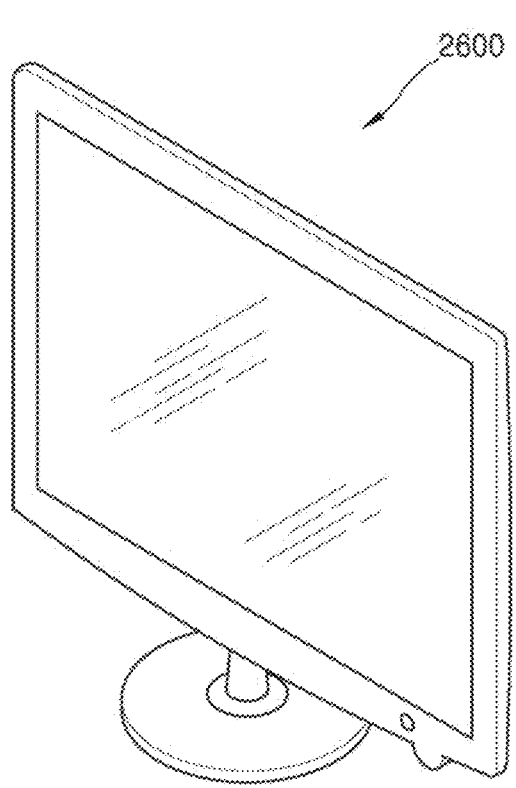
Figure 30:
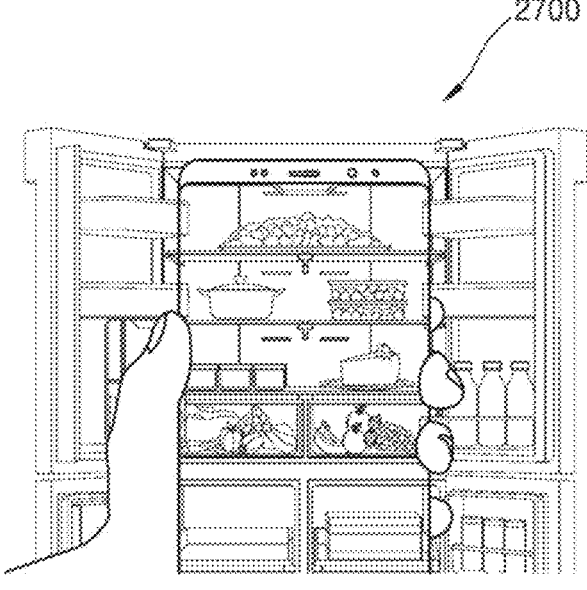

The image sensor 1000 according to some example embodiments may be applied to a mobile phone or smart phone 2200 shown in FIG. 25, a tablet or smart tablet 2300 shown in FIG. 26, and a digital camera or camcorder 2400 shown in FIG. 27, a notebook computer 2500 shown in FIG. 28, or a television or smart television 2600 shown in FIG.

29. For example, the smart phone 2200 or the smart tablet 2300 may include a plurality of high-resolution cameras each having a high-resolution image sensor mounted thereon. The high-resolution cameras may be used to extract depth information of objects in an image, adjust out-focusing of an image, or automatically identify objects in an image.

Figure 31:
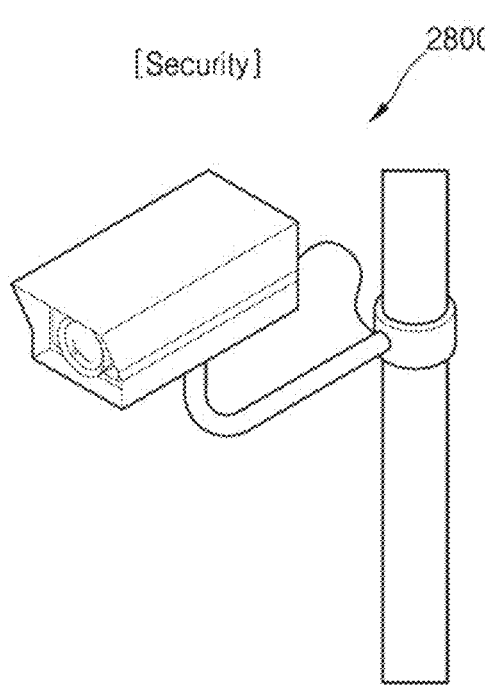
Figure 32:
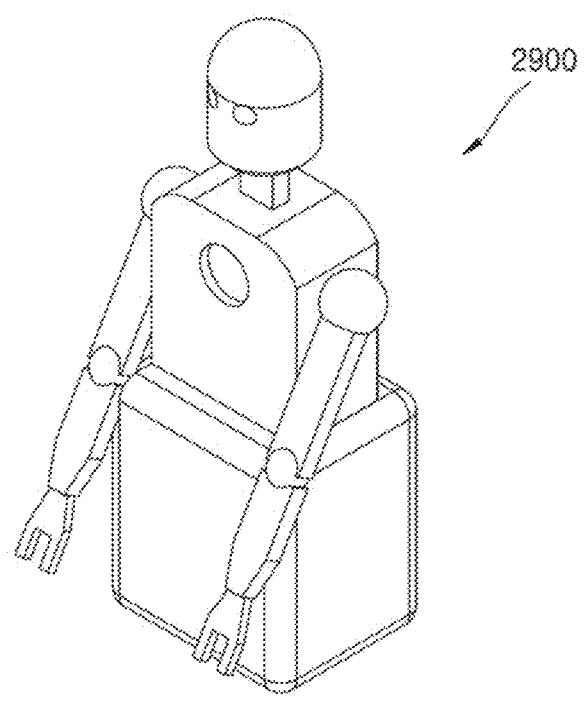
Figure 33:
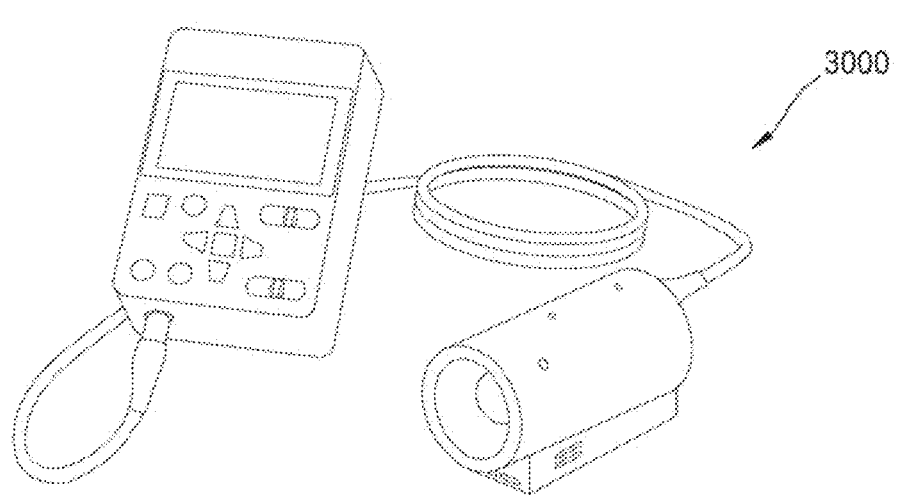

In addition, the image sensor 1000 may be applied to a smart refrigerator 1700 shown in FIG. 21, a security camera 1800 shown in FIG. 31, a robot 2900 shown in FIG. 33, a medical camera 3000 shown in FIG. 33, etc. For example, the smart refrigerator 2700 may automatically recognize food in the refrigerator by using an image sensor, and inform the user of the presence of specific food, the type of food put in or take out, and the like through a smartphone. The security camera 2800 may provide an ultra-high-resolution image and may recognize an object or a person in an image even in a dark environment by using high sensitivity. The robot 2900 may provide a high-resolution image by being input at a disaster or industrial site that cannot be directly accessed by a person. The medical camera 3000 may provide a high-resolution image for diagnosis or surgery, and may dynamically adjust a field of view.

Figure 34:
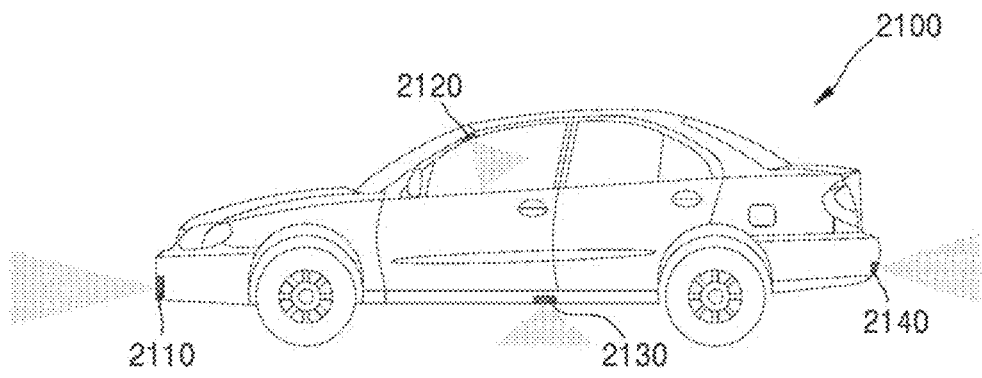

Also, the image sensor 1000 may be applied to a vehicle 2100 as shown in FIG. 34. The vehicle 2100 may include a plurality of vehicle cameras 2110, 2120, 2130, and 2140 disposed in various positions. Each of the vehicle cameras 2110, 2120, 2130, and 2140 may include an image sensor according to an example embodiment. The vehicle 2100 may provide a driver with various information about an interior or surroundings of the vehicle 2100 by using the plurality of vehicle cameras 2110, 2120, 2130, and 2140, and provide information necessary for autonomous driving by automatically recognizing objects or people in the image.

In the image sensor described above, each of a plurality of pixels may detect light of a plurality of types of wavelength bands separately.

The image sensor described above includes an autofocusing pixel and also includes a lens array including a super lens suitable for autofocusing, so that autofocus driving is possible.

The image sensor described above may exhibit relatively high optical efficiency by not using components, such as a color separation element and a color filter.

The image sensor described above may be used as a multi-color sensor, a multi-wavelength sensor, a hyperspectral sensor, and may be used as a 3D image sensor that provides both a color image and a depth image.

The image sensor described above may be may be applied as a high resolution camera module to be utilized in various electronic apparatuses.

Although the image sensor described above and the electronic apparatus including the image sensor have been described with reference to the example embodiment shown in the drawings, this is merely an example. Therefore, it will be understood by those skilled in the art that various changes in form and details may be made therein without departing from the spirit and scope of the disclosure. The example embodiments should be considered in descriptive sense only and not for purposes of limitation. Therefore, the scope of the disclosure is defined not by the detailed description of the disclosure but by the appended claims, and all differences within the scope will be construed as being included in the disclosure.

What is claimed is:

1. An image sensor comprising:

a pixel array comprising a plurality of imaging pixels and a plurality of autofocusing pixels; and a lens array comprising a plurality of micro lenses facing the plurality of imaging pixels in a one-to-one correspondence, and a super lens facing all of autofocusing pixels included in an autofocusing pixel group among the plurality of autofocusing pixels, wherein each imaging pixel of the plurality of imaging pixels comprises:

a first red meta-photodiode configured to selectively absorb light of a red wavelength band;

a first green meta-photodiode configured to selectively absorb light of a green wavelength band; and a first blue meta-photodiode configured to selectively absorb light of a blue wavelength band, and wherein a width of each imaging pixel of the plurality of imaging pixels is greater than or equal to 0.25 µm and less than or equal to 0.45 µm.

2. The image sensor of claim 1, wherein each autofocusing pixel of the plurality of autofocusing pixels comprises:

a second red meta-photodiode configured to selectively absorb light of the red wavelength band;

a second green meta-photodiode configured to selectively absorb light of the green wavelength band; and a second blue meta-photodiode configured to selectively absorb light of the blue wavelength band.

3. The image sensor of claim 2, wherein an arrangement of the first red meta-photodiode, the first green meta-photodiode, and the first blue meta-photodiode included in each imaging pixel of the plurality of imaging pixels is same as an arrangement of the second red meta-photodiode, the second green meta-photodiode, and the second blue meta-photodiode included in each autofocusing pixel of the plurality of autofocusing pixels.

4. The image sensor of claim 2, wherein the first red meta-photodiode, the first green meta-photodiode, and the first blue meta-photodiode included in each imaging pixel of the plurality of imaging pixels are not symmetrically provided, and wherein the second red meta-photodiode, the second green meta-photodiode, and the second blue meta-photodiode included in each autofocusing pixel of the plurality of autofocusing pixels are symmetrically provided.

5. The image sensor of claim 1, wherein each of the plurality of autofocusing pixels comprises a photodetector.

6. The image sensor of claim 1, wherein each of the plurality of micro lenses and the super lens included in the lens array is a refractive lens having a curved surface or a meta lens comprising a plurality of nanostructures.

7. The image sensor of claim 1, wherein the super lens has a shape corresponding to $M^2$ autofocusing pixels provided in M×M arrangement, where M is an integer greater than or equal to 2.

8. The image sensor of claim 1, wherein the super lens has a shape corresponding to N autofocusing pixels provided in 1×N or N×1 arrangement, where N is an integer greater than or equal to 2.

9. The image sensor of claim 1, wherein the super lens has a shape corresponding to the plurality of autofocusing pixels in a cross shape.

10. The image sensor of claim 1, wherein the width of each imaging pixel of the plurality of imaging pixels is less than or equal to a diffraction limit.

11. The image sensor of claim 1, wherein each of the first red meta-photodiode, the first green meta-photodiode, and the first blue meta-photodiode comprises a first conductivity type semiconductor layer, an intrinsic semiconductor layer, and a second conductivity type semiconductor layer provided in a first direction, and wherein a first width of a cross-section of the first red meta-photodiode perpendicular to the first direction, a second width of a cross-section of the first green meta-photodiode perpendicular to the first direction, and a third width of the first blue meta-photodiode perpendicular to the first direction are different from each other.

12. The image sensor of claim 11, wherein the first width is greater than the second width, and the second width is greater than the third width.

13. The image sensor of claim 1, wherein a number of first red meta-photodiodes, including the first red meta-photodiode, included in one imaging pixel of the plurality of imaging pixels is one, wherein a number of first green meta-photodiodes, including the first green meta-photodiode, included in the one imaging pixel is one, wherein a number of first blue meta-photodiodes, including the first blue meta-photodiode, included in the one imaging pixel is two, and wherein the first red meta-photodiodes, the first green meta-photodiodes, and the first blue meta-photodiodes are provided such that a line connecting centers of the four meta-photodiodes forms a square.

14. The image sensor of claim 13, wherein the two first blue meta-photodiodes are provided in a diagonal direction of the square.

15. The image sensor of claim 1, wherein a number of first red meta-photodiodes, including the first red meta-photodiode, included in one imaging pixel of the plurality of imaging pixels is one, wherein a number of first green meta-photodiodes, including the first green meta-photodiode, and a number of first blue meta-photodiodes, including the first blue meta-photodiode, included in the one imaging pixel are greater than one, respectively, and wherein the first red meta-photodiode is provided at a center of the one imaging pixel.

16. The image sensor of claim 15, wherein the first green meta-photodiodes and the first blue meta-photodiodes are provided adjacent to the first red meta-photodiode in a square shape or regular hexagonal shape.

17. The image sensor of claim 1, wherein each of the plurality of imaging pixels further comprises an infrared meta-photodiode configured to selectively absorb light of an infrared wavelength band.

18. An electronic apparatus comprising:

a lens assembly comprising one or more lenses, the lens assembly being configured to form an optical image of an object;

an image sensor configured to convert the optical image formed by the lens assembly into an electrical signal; and a processor configured to process the electrical signal generated by the image sensor, wherein the image sensor comprises:

a pixel array comprising a plurality of imaging pixels and a plurality of autofocusing pixels; and a lens array comprising a plurality of micro lenses facing the plurality of imaging pixels in a one-to-one correspondence, and a super lens facing all of autofocusing pixels included in an autofocusing pixel group among the plurality of autofocusing pixels, and wherein each imaging pixel of the plurality of imaging pixels comprises:

a red meta-photodiode configured to selectively absorb light of a red wavelength band;

a green meta-photodiode configured to selectively absorb light of a green wavelength band; and a blue meta-photodiode configured to selectively absorb light of a blue wavelength band, and wherein a width of each imaging pixel of the plurality of imaging pixels is greater than or equal to 0.25 μm and less than or equal to 0.45 μm.

19. The electronic apparatus of claim 18, wherein the processor is further configured to generate an autofocusing driving signal from an electrical signal corresponding to the plurality of autofocusing pixels, and wherein one of the one or more lenses included in the lens assembly is configured to move based on the autofocusing driving signal.

\* \* \* \* \*